United States Patent
Kuo et al.

(10) Patent No.: US 12,444,716 B2
(45) Date of Patent: Oct. 14, 2025

(54) LIGHT-EMITTING DIODE DEVICE

(71) Applicant: Lextar Electronics Corporation, Hsinchu (TW)

(72) Inventors: Shiou-Yi Kuo, Hsinchu (TW);
Te-Chung Wang, Hsinchu (TW);
Guo-Yi Shiu, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 406 days.

(21) Appl. No.: 18/185,531

(22) Filed: Mar. 17, 2023

(65) Prior Publication Data
US 2023/0299056 A1   Sep. 21, 2023

Related U.S. Application Data

(60) Provisional application No. 63/321,790, filed on Mar. 21, 2022.

(30) Foreign Application Priority Data

Sep. 14, 2022   (TW) .................................. 111134657

(51) Int. Cl.
*H01L 25/075*      (2006.01)
*H01L 25/16*       (2023.01)
(Continued)

(52) U.S. Cl.
CPC ........ *H01L 25/0753* (2013.01); *H01L 25/167* (2013.01); *H10D 86/441* (2025.01);
(Continued)

(58) Field of Classification Search
CPC . H01L 25/0753; H01L 25/075; H01L 25/167; H01L 25/16; H10D 86/441;
(Continued)

(56) References Cited

U.S. PATENT DOCUMENTS

| | | |
|---|---|---|
| 2011/0244611 A1 | 10/2011 | Kim |
| 2018/0135809 A1 | 5/2018 | Kim |
| | (Continued) | |

FOREIGN PATENT DOCUMENTS

| | | |
|---|---|---|
| TW | 201834263 A | 9/2018 |
| TW | 202002274 A | 1/2020 |
| TW | 202107072 A | 2/2021 |

OTHER PUBLICATIONS

Chinese language office action dated Aug. 7, 2023, issued in application No. TW 111134657.
(Continued)

*Primary Examiner* — Nikolay K Yushin
(74) *Attorney, Agent, or Firm* — McClure, Qualey & Rodack, LLP

(57) ABSTRACT

A light-emitting diode device including a pixel structure including first, second and third light-emitting diode chips, a passivation layer, and first, second, third and fourth circuit layers is provided. The first and second light-emitting diode chips are positioned on a top surface opposite to a light-emitting surface of the third light-emitting diode chip. First and second vertical projections of the first and second light-emitting diode chips on the top surface do not overlap each other. First and second bonding surfaces of the first and second circuit layers corresponding to openings in the passivation layer are positioned to overlap the first vertical projection and are separated from the second vertical projection. Third and fourth bonding surfaces of the third and fourth circuit layers that correspond to openings in the passivation layer are positioned to overlap the second vertical projection and are separated from the first vertical projection.

17 Claims, 20 Drawing Sheets

(51) Int. Cl.
  *H01L 27/12* (2006.01)
  *H01L 33/10* (2010.01)
  *H01L 33/62* (2010.01)
  *H10D 86/40* (2025.01)
  *H10D 86/60* (2025.01)
  *H10H 20/814* (2025.01)
  *H10H 20/857* (2025.01)

(52) U.S. Cl.
  CPC .......... *H10D 86/60* (2025.01); *H10H 20/814* (2025.01); *H10H 20/857* (2025.01)

(58) Field of Classification Search
  CPC ...... H10D 86/40; H10D 86/60; H10D 86/411; H10H 20/814; H10H 20/857; H10H 20/841; H10H 20/84; H10H 20/00; H10H 20/831; H10H 29/10; H10H 29/30; H10H 29/142
  See application file for complete search history.

(56) References Cited

U.S. PATENT DOCUMENTS

| | | |
|---|---|---|
| 2019/0165207 A1 | 5/2019 | Kim et al. |
| 2020/0052151 A1 | 2/2020 | Kang |
| 2020/0144232 A1 | 5/2020 | Chae et al. |
| 2020/0350463 A1 | 11/2020 | Horng et al. |
| 2021/0375980 A1 | 12/2021 | Jang et al. |
| 2021/0408101 A1 | 12/2021 | Lee |
| 2022/0005792 A1 | 1/2022 | Chae |

OTHER PUBLICATIONS

Chinese language office action dated Dec. 16, 2024, issued in application No. TW 113108500.

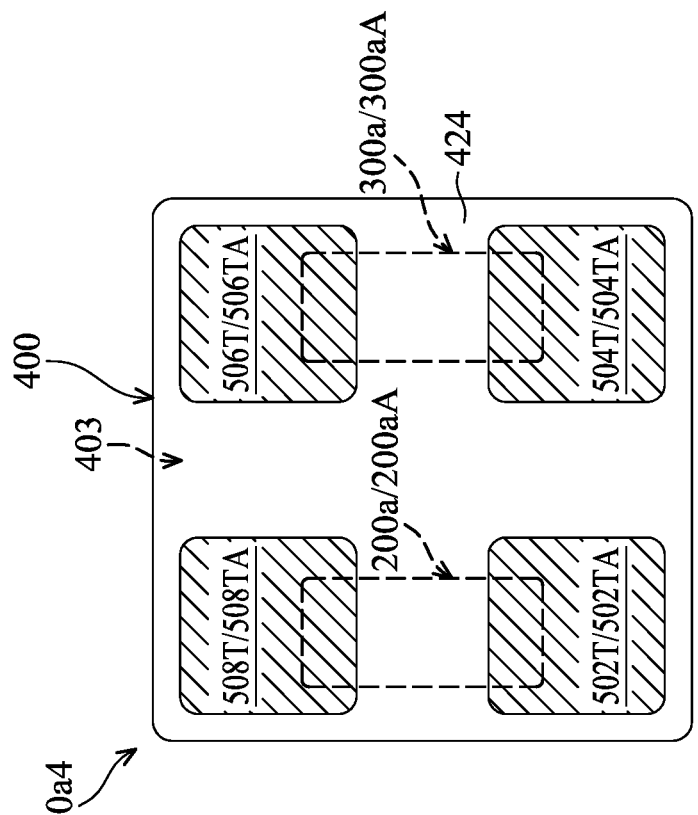
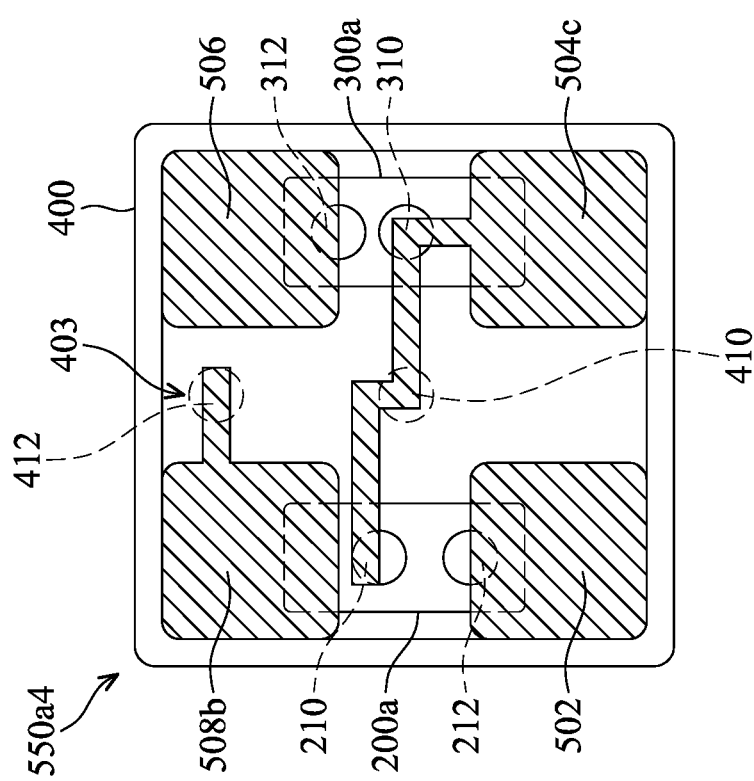
FIG. 12B
FIG. 12A

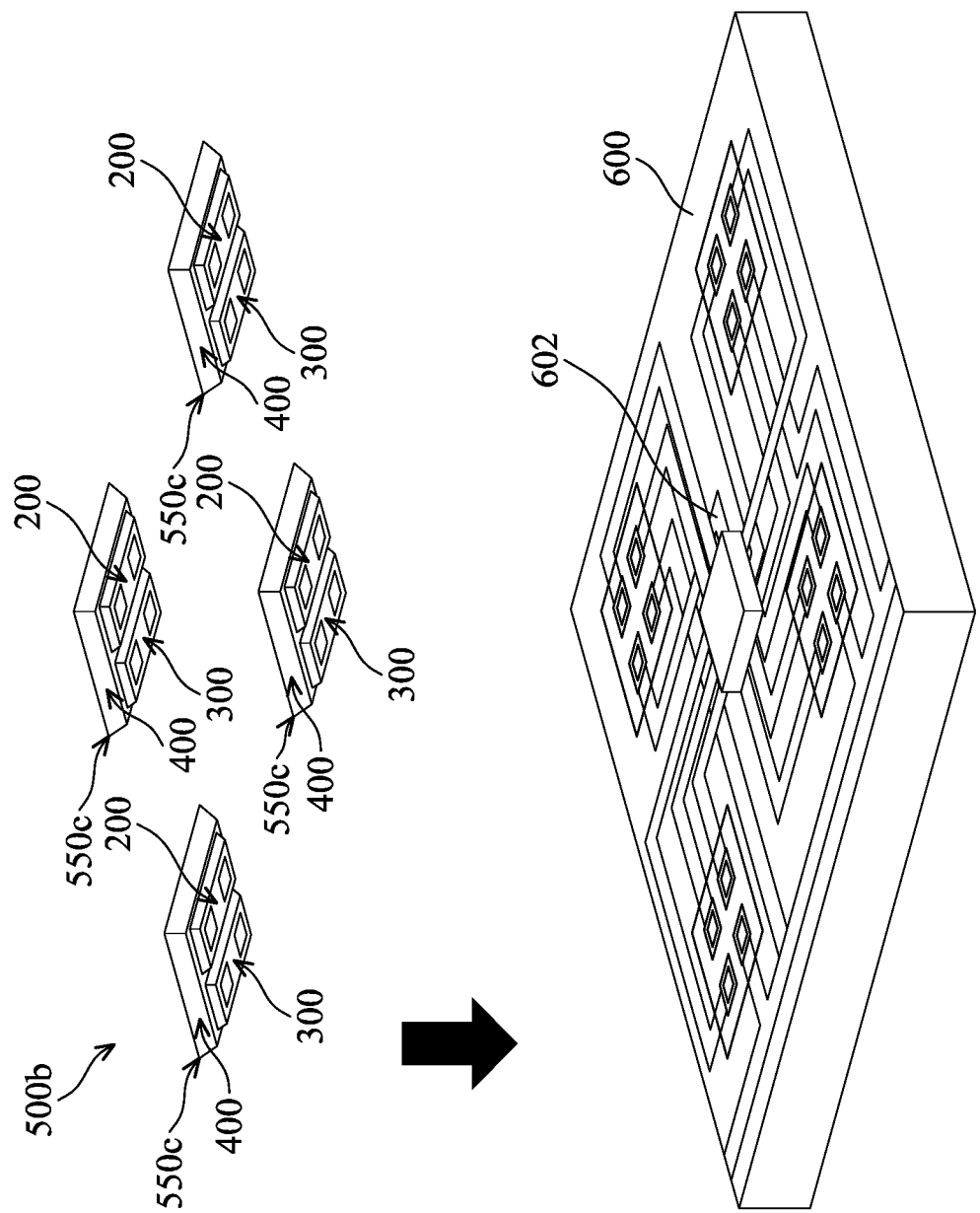

LIGHT-EMITTING DIODE DEVICE

CROSS REFERENCE TO RELATED APPLICATIONS

This application claims the benefit of U.S. Provisional Application No. 63/321,790, filed on Mar. 21, 2022 and claims priority of Taiwan Patent Application No. 111134657, filed on Sep. 14, 2022, which are incorporated by reference herein in their entireties.

BACKGROUND OF THE DISCLOSURE

Field of the Disclosure

The present disclosure relates to a light-emitting diode device, and, in particular, to a pixel structure of a light-emitting diode device.

Description of the Related Art

Since light-emitting diodes (LEDs) have the advantage of low power consumption, light-emitting diode displays have become a mainstream in the field of display technology. Because the thickness and size of the light-emitting diodes cannot be reduced any further, the pixel structure composed of red, green, and blue light-emitting diodes in the display has a high aspect ratio, and the complexity of the bonding processes and the wiring processes of the light-emitting diode is increased. Therefore, it is difficult for the current pixel structure of the light-emitting diode to achieve the goals of small spacing, large light-emitting area, high process yield and low cost.

BRIEF SUMMARY OF THE DISCLOSURE

An embodiment of the present disclosure provides a light-emitting diode device. The light-emitting diode device includes a pixel structure. The pixel structure includes a first light-emitting diode chip, a second light-emitting diode chip, a third light-emitting diode chip, a passivation layer, a first circuit layer, a second circuit layer, the third circuit layer and the fourth circuit layer. The third light-emitting diode chip has a light-emitting surface and a top surface opposite to each other, wherein the first light-emitting diode chip and the second light-emitting diode chip are disposed side by side on the top surface. The first light-emitting diode chip has a first vertical projection on the top surface. The second light-emitting diode chip has a second vertical projection on the top surface. The first vertical projection and the second vertical projection do not overlap each other. The passivation layer covers the first light-emitting diode chip, second light-emitting diode chip and third light-emitting diode chip. The first circuit layer, the second circuit layer, the third circuit layer and the fourth circuit layer separated from each other are located between the third light-emitting diode chip and the passivation layer. The passivation layer has openings. The openings respectively correspond to and are located on a first bonding surface of the first circuit layer, a second bonding surface of the second circuit layer, a third bonding surface of the third circuit layer and a fourth bonding surface of the fourth circuit layer. Vertical projections of the first bonding surface and the second bonding surface on the top surface respectively overlap the first vertical projection and are separated from the second vertical projection. Vertical projections of the third bonding surface and the fourth bonding surface on the top surface respectively overlap with the second vertical projection and are separated from the first vertical projection.

BRIEF DESCRIPTION OF THE DRAWINGS

The present disclosure can be more fully understood by reading the subsequent detailed description and examples with references made to the accompanying drawings, wherein:

FIGS. 12A and 12B are schematic top views of the light-emitting diode device in accordance with some embodiments of the disclosure, showing the arrangements of light-emitting diode chips, circuit layers, bonding surfaces and passivation layers of the light-emitting diode device;

FIG. 18 is a schematic three-dimensional view of the light-emitting diode device in accordance with some embodiments of the disclosure, showing the method of bonding the pixel structure of the light-emitting diode device without the native substrate to the micro-control element and the circuit substrate.

DETAILED DESCRIPTION OF THE DISCLOSURE

Figures 1, 2:
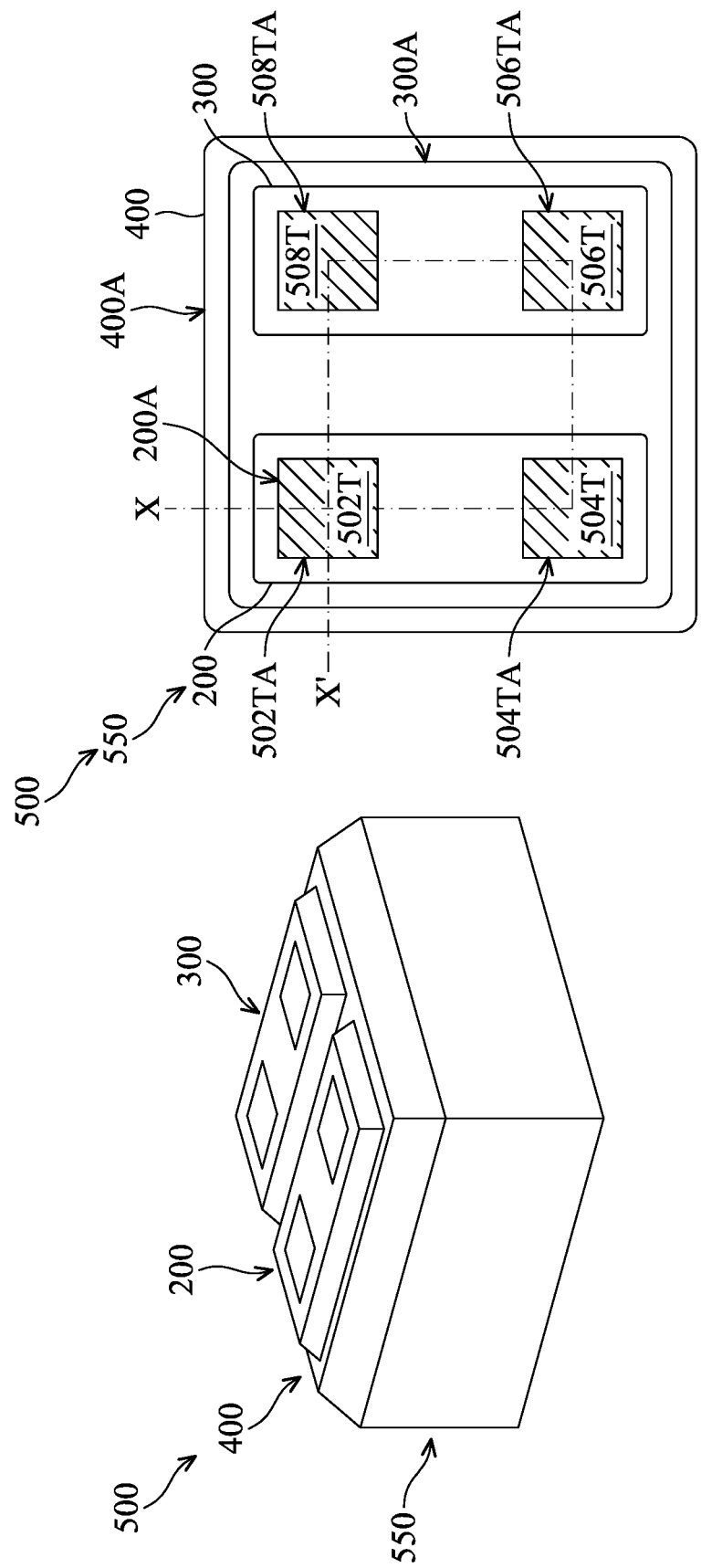
FIG. 1 is a three-dimensional schematic diagram of a light-emitting diode device in accordance with some embodiments of the disclosure.
FIG. 2 is a schematic top view of the light-emitting diode device in accordance with some embodiments of the disclosure.

The following description is made for the purpose of illustrating the general principles of the disclosure and should not be taken in a limiting sense. The scope of the disclosure is best determined by reference to the appended claims.

The embodiments of the present disclosure are described fully hereinafter with reference to the accompanying drawings, and the advantages and features of the present disclosure and methods of achieving them will be apparent from the following exemplary embodiments that will be described in more detail with reference to the accompanying drawings. It should be noted, however, that the present disclosure is not limited to the following exemplary embodiments, and may be implemented in various forms. Accordingly, the exemplary embodiments are provided only to disclose the present disclosure and let those skilled in the art know the category of the present disclosure. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the disclosure.

Embodiments of the disclosure provide a light-emitting diode device. The light-emitting diode device stacks two mini light-emitting diode chips or two micro light-emitting diode chips side by side on a top surface of a mini light-emitting diode chip or a micro light-emitting diode chip to form a single pixel structure. The pixel structure is arranged with the configurations of circuit layers and four bonding surfaces (including the anode bonding surface of each of the three light-emitting diode chips and the common-cathode bonding surface of the three light-emitting diode chips) of each of the light-emitting diode chips to dispose two of the anode bonding surfaces over one of the side-by-side stacked light-emitting diode chips. The other anode bonding surface and the common-cathode bonding surface are located over the other one of the side-by-side stacked light-emitting diode chips. In addition, a light-emitting surface of the light-emitting diode device is located opposite to the top surface of the lower light-emitting diode chip. The light-emitting diode device in accordance with some embodiments of the disclosure can further reduce the volume of the pixel structure, simplify the manufacturing processes, increase the light-emitting area and reduce the cost. In the light-emitting diode device, the mini light-emitting diode chip has a native substrate which comprises an as-grown substrate such as sapphire, GaAs, and silicon substrate, and the micro light-emitting diode chip does not have the native substrate.

Figure 3A:
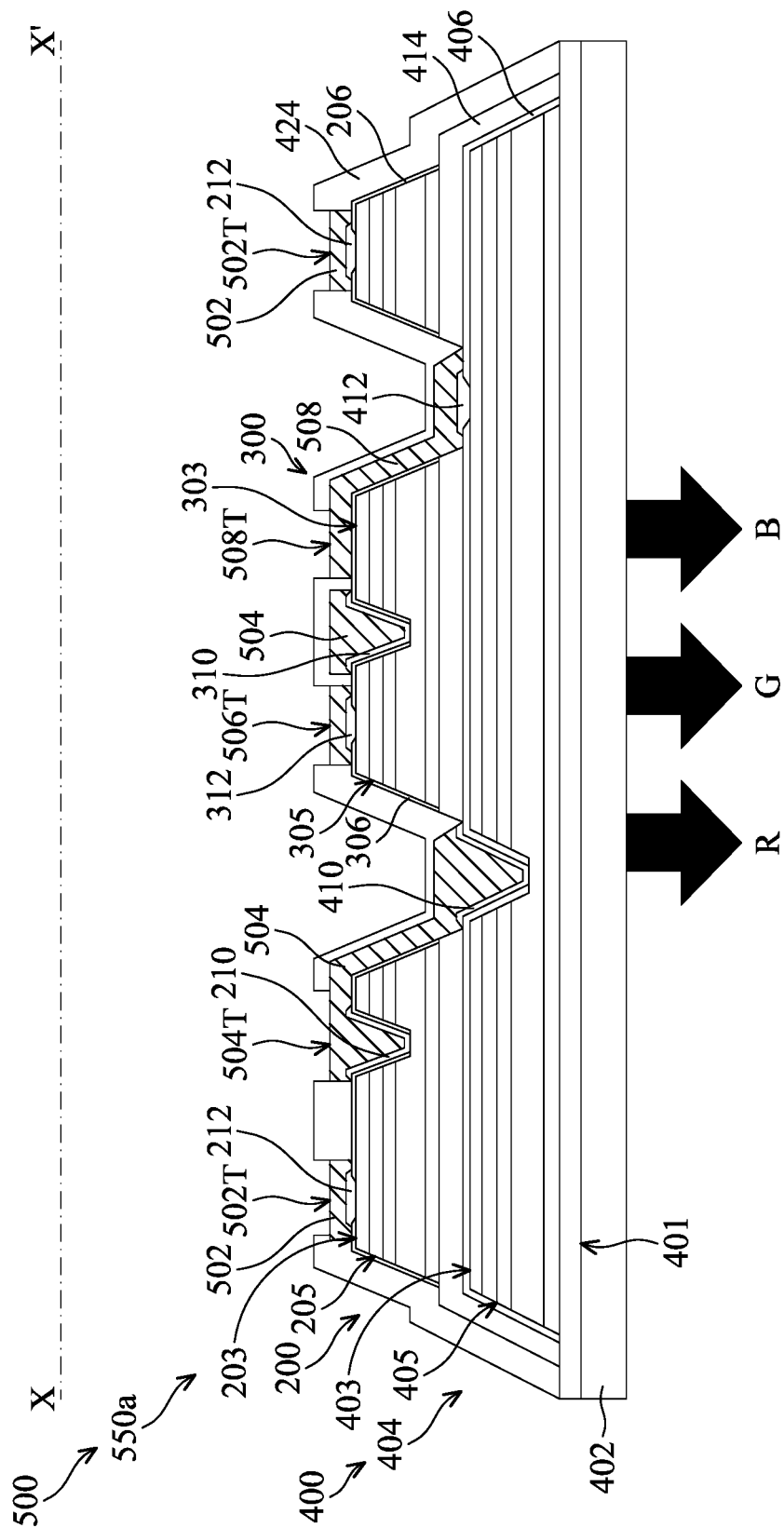
FIG. 3A is a schematic cross-sectional view along the line X-X' of the light-emitting diode device shown in FIG. 2 in accordance with some embodiments of the disclosure.

FIG. 1 is a three-dimensional schematic diagram of a light-emitting diode device 500 in accordance with some embodiments of the disclosure. FIG. 2 is a schematic top view of the light-emitting diode device 500 in accordance with some embodiments of the disclosure. FIG. 3A is a schematic cross-sectional view along the line X-X' of a pixel structure 550a of the light-emitting diode device 500 shown in FIG. 2 in accordance with some embodiments of the disclosure. The light-emitting diode device 500 includes the pixel structure 550 (including pixel structures 550a and 550b in FIGS. 3A and 3B). The pixel structure 550 includes a first light-emitting diode chip 200, a second light-emitting diode chip 300, a third light-emitting diode chip 400 and a passivation layer 424. FIG. 1 only shows the first light-emitting diode chip 200, the second light-emitting diode chip 300 and the third light-emitting diode chip 400 for illustration, the passivation layer 424 and the remaining features may be shown in the schematic cross-sectional view shown in FIG. 3A.

As shown in FIG. 3A, the third light-emitting diode chip 400 has a light-emitting surface 401 and a top surface 403 opposite to each other. The first light-emitting diode chip 200 and the second light-emitting diode chip 300 are arranged side by side on the on the top surface 403 of the third light-emitting diode chip 400. As shown in FIG. 2, the first light-emitting diode chip 200 has a first vertical projection 200A on the top surface 403 of the third light-emitting diode chip 400. The second light-emitting diode chip 300 has a second vertical projection 300A on the top surface 403 of the third light-emitting diode chip 400. The first vertical projection 200A and the second vertical projection 300A do not overlap each other.

As shown in FIG. 3A, the first light-emitting diode chip 200 includes a first electrode 210 and a second electrode 212 away from the top surface 403 of the third light-emitting diode chip 400. The second light-emitting diode chip 300 includes a first electrode 310 and a second electrode 312 away from the top surface 403 of the third light-emitting diode chip 400. The third light-emitting diode chip 400 includes a first electrode 410 and a second electrode 412 away from the light-emitting surface 401. In some embodiments, the first electrodes 210, 310 and 410 have the same polarity opposite to the polarity of the second electrodes 212, 312 and 412. In some embodiments, the first electrodes 210, 310 and 410 and the second electrodes 212, 312 and 412 include conductive materials such as chromium (Cr), aluminum (Al), nickel (Ni), gold (Au), platinum (Pt), tin (Sn), copper (Cu) or a combination thereof, and can be formed by a plating process such as evaporation or electroplating and a subsequent patterning process.

In addition, the first light-emitting diode chip 200 includes an insulating layer 206 covering a sidewall 205 and a portion of the top surface 203 of the first light-emitting diode chip 200. The second light-emitting diode chip 300 includes an insulating layer 306 covering a sidewall 305 and a portion of a top surface 303 of the second light-emitting diode chip 300. The third light-emitting diode chip 400 includes an insulating layer 406 covering a sidewall 405 and a portion of the top surface 403 of the third light-emitting diode chip 400. In some embodiments, the insulating layers 206, 306 and 406 include insulating materials such as silicon dioxide ($SiO_2$), aluminum oxide ($Al_2O_3$), titanium dioxide ($TiO_2$), with good step coverage, and can be formed by a deposition process, for example, chemical vapor deposition (CVD), atomic layer deposition (ALD). In some embodiments, the insulating layers 206, 306 and 406 include insulating materials such as polyimide (PI), epoxy, benzocyclobutene (BCB) with low dielectric constant and good step coverage and can be formed by, for example, spin coating, spray coating or other suitable coating processes.

As shown in FIG. 2, the first light-emitting diode chip 200 has a first top view area (having the same shape and size as those of the first vertical projection 200A). The second light-emitting diode chip 300 has a second top view area (having the same shape and size as those of the second vertical projection 300A). The third light-emitting diode chip has a third top view area 400A. In some embodiments, the first top view area of the first light-emitting diode chip 200 is the same as or different from the second top view area of the second light-emitting diode chip 300. In some embodiments, a total area of the first top view area and the second top view area is smaller than the third top view area 400A.

As shown in FIG. 3A, the light-emitting surfaces of the first light-emitting diode chip 200 and the second light-emitting diode chip 300 both face the light-emitting surface 401 of the third light-emitting diode chip 400, so that the color lights emitted by the first light-emitting diode chip 200 and the second light-emitting diode chip 300 are mixed with the color light emitted by the third light-emitting diode chip 400 to emit a mixed light. In some embodiments, the first light-emitting diode chip 200, the second light-emitting diode chip 300 and the third light-emitting diode chip 400 may emit lights of different colors (such as red light R, green light G or blue light B). For example, the first light-emitting diode chip 200 may emit a first color light, the second light-emitting diode chip 300 may emit a second color light, and the third light-emitting diode chip 400 may emit a third color light. The first color light, the second color light and the third color light have different wavelength ranges respectively. For example, as shown in FIG. 3A, when the first color light is red light R, the second color light is blue light B, and the third color light is green light G, the wavelength range of the third color light is between the wavelength range of the first color light and the wavelength range of the second color light. For example, when the first color light is red light R, the second color light is green light G, and the third color light is blue light B, the wavelength range of the second color light is between the wavelength range of the first color light and the wavelength range of the third color light.

In some embodiments, the first light-emitting diode chip 200, the second light-emitting diode chip 300 and the third light-emitting diode chip 400 include mini light-emitting diode chips or micro light-emitting diode chips. For example, the first light-emitting diode chip 200 and the second light-emitting diode chip 300 may be micro light-emitting diode chips, and the third light-emitting diode chip 400 may be a mini light-emitting diode chip. In some embodiments shown in FIG. 3A, the first light-emitting diode chip 200 and the second light-emitting diode chip 300 do not include native substrates. In addition, the third light-emitting diode chip 400 includes a native substrate 402 close to the light-emitting surface 401. In another example, the first light-emitting diode chip 200, the second light-emitting diode chip 300 and the third light-emitting diode chip 400 can all be micro light-emitting diode chip. Therefore, in other embodiments, the first light-emitting diode chip 200, the second light-emitting diode chip 300 and the third light-emitting diode chip 400 do not include native substrates.

As shown in FIG. 3A, the pixel structure 550a of the light-emitting diode device 500 further includes a transparent bonding layer 414. The transparent bonding layer 414 is sandwiched between the first light-emitting diode chip 200, the second light-emitting diode chip 300 and the third light-emitting diode chip 400 and covers the insulating layer 406. In some embodiments, the transparent bonding layer 414 includes benzocyclobutene (BCB), SU-8 epoxy resin, silicone, epoxy, spin-on-glass (SOG) or a combination thereof and can be formed by, for example, spin coating or other suitable coating process and a subsequent patterning process.

Figure 3B:
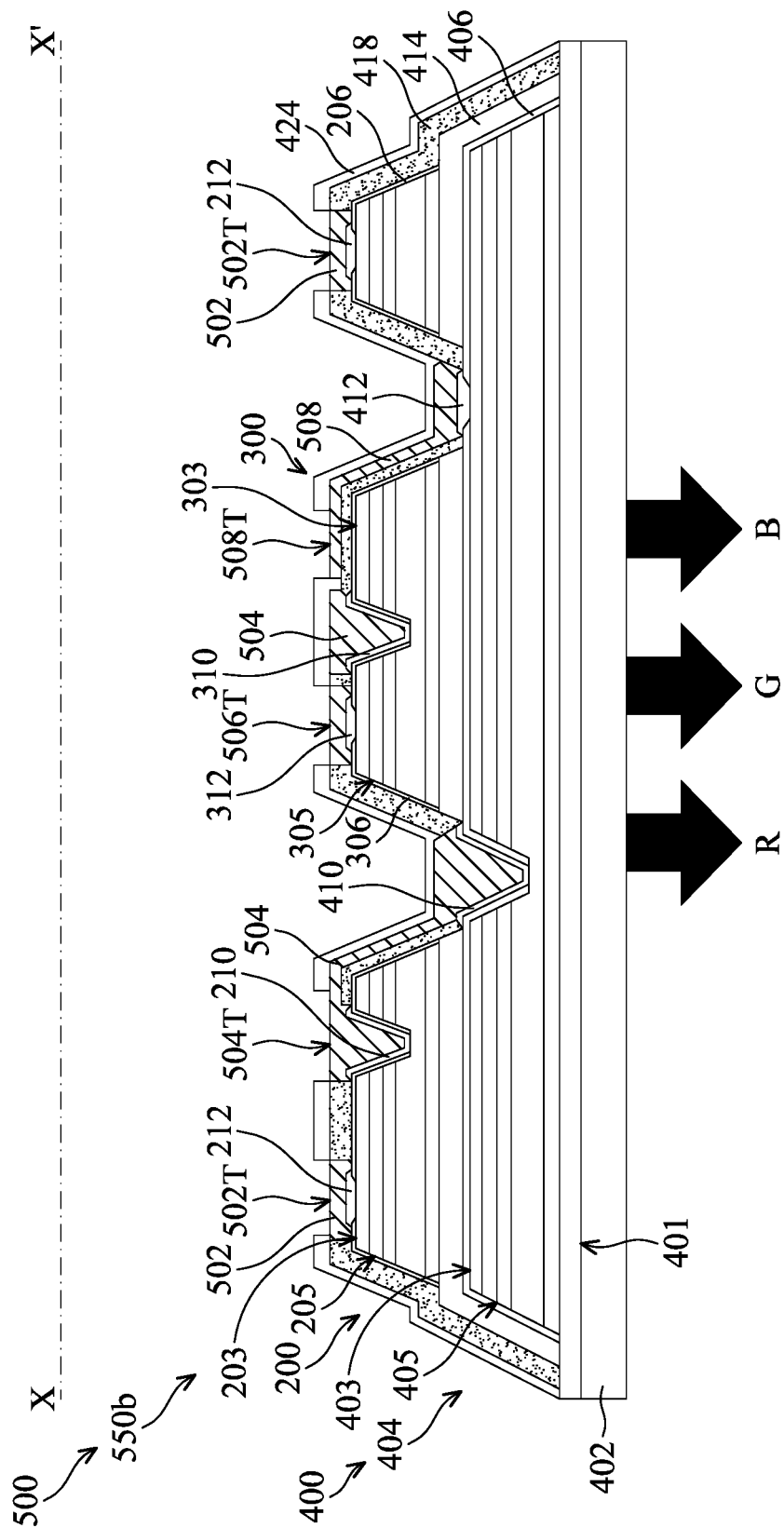
FIG. 3B is a schematic cross-sectional view along the line X-X' of the light-emitting diode device shown in FIG. 2 in accordance with some embodiments of the disclosure.

As shown in FIGS. 3A and 3B, the pixel structure 550 of the light-emitting diode device 500 further includes a passivation layer 424 covering the first light-emitting diode chip 200, the second light-emitting diode chip 300 and the third light-emitting diode chip 400. In some embodiments, the passivation layer 126 includes polyimide (PI), benzocyclobutene (BCB), parylene, polynaphthalenes, fluorocarbons, acrylate or a combination thereof, and can be formed by coating or other suitable processes and a subsequent patterning process.

As shown in FIGS. 2 and 3A, the pixel structure 550a of the light-emitting diode device 500 further includes a first circuit layer 502, a second circuit layer 504, a third circuit layer 506 and a fourth circuit layer 508, which are separated from each other and located between the third light-emitting diode chip 400 and the passivation layer 424. In some embodiments, each of the first circuit layer 502 and the second circuit layer 504 is respectively disposed on the top surface 203 of the first light-emitting diode chip 200 and away from the third light-emitting diode chip 400, so that the first light-emitting diode chip 200 is sandwiched between the first circuit layer 502, the second circuit layer 504 and the third light-emitting diode chip 400. Each of the third circuit layer 506 and the fourth circuit layer 508 is disposed on the top surface 303 of the second light-emitting diode chip 300 and away from the third light-emitting diode chip 400, so that the second light-emitting diode chip 300 is sandwiched between the third circuit layer 506, the fourth circuit layer 508 and the second light-emitting diode chip 300. In addition, the second circuit layer 504 may extend to cover the top surface 403 of the second light-emitting diode chip 300. The fourth circuit layer 508 may extend and cover the top surface 403 of the second light-emitting diode chip 300 and be electrically insulated from the second light-emitting diode chip 300.

As shown in FIG. 3A, the second circuit layer 504 are electrically connected the first electrodes 210, 310 and 410 simultaneously. The first circuit layer 502, the third circuit layer 506 and the fourth circuit layer 508 are respectively electrically connected to the second electrodes 212, 312 and 412 of the first light-emitting diode chip 200, the second light-emitting diode chip 300 and the third light-emitting diode chip 400. In some embodiments, the second circuit layer 504 is simultaneously electrically connected to the first electrode 210 of the first light-emitting diode chip 200, the first electrode 310 of the second light-emitting diode chip 300 and the first electrodes 410 of the third light-emitting diode chip 400 having the same polarity, so that the first electrode 210 of the first light-emitting diode chip 200, the first electrode 310 of the second light-emitting diode chip 300 and the first electrodes 410 of the third light-emitting diode chip 400 are electrically connected to each other (when the first electrode is a cathode, the second circuit layer 504 may serve as a common-cathode circuit layer). In addition, the second electrode 212 of the first light-emitting diode chip 200, the second electrode 312 of the second light-emitting diode chip 300 and the second electrode 412 of the third light-emitting diode chip 400 having the same polarity are respectively electrically connected the first circuit layer 502, the third circuit layer 506 and the fourth circuit layer 508. In some embodiments, the first circuit layer 502, the third circuit layer 506, and the fourth circuit layer 508 include a conductive material such as chromium (Cr), aluminum (Al), nickel (Ni), gold (Au), platinum (Pt), tin (Sn), copper (Cu) or a combination thereof, and can be formed by a plating process such as evaporation or electroplating and a subsequent patterning process.

The passivation layer 424 has openings, and the openings are respectively located on a first bonding surface 502T of the first circuit layer 502, a second bonding surface 504T of the second circuit layer 504, a third bonding surface 506T of the third circuit layer 506 and a fourth bonding surface 508T of the fourth circuit layer 508. As shown in FIG. 2, vertical projections 502TA and 504TA of the first bonding surface 502T and the second bonding surface 504T on the top surface 403 of the third light-emitting diode chip 400 both overlap the first vertical projection 200A, and are both separated from the second vertical projection 300A. Vertical projections 506TA and 508TA of the third bonding surface 506T and the fourth bonding surface 508T on the top surface 403 of the third light-emitting diode chip 400 both overlap the second vertical projection 300A, and both are separated from the first vertical projection 200A. In some embodiments, the first circuit layer 502, the second circuit layer 504, the third circuit layer 506 and the fourth circuit layer 508 exposed from the openings in the passivation layer 424. The exposed portions of circuit layers from the openings in the passivation layer 424 form the first bonding surface 502T, the second bonding surface 504T, the third bonding surface 506T and the fourth bonding surface 508T. In some embodiments, the first circuit layer 502, the second circuit layer 504, the third circuit layer 506 and the fourth circuit layer 508 exposed from the openings in the passivation layer 424. In addition, four metal pads (not shown) formed on the openings to connect electrically with circuit layers respectively so the surfaces of the metal pads form the first bonding surface 502T, the second bonding surface 504T, the third bonding surface 506T and the fourth bonding surface 508T separately. In some embodiments, the first bonding surface 502T, the second bonding surface 504T, the third bonding surface 506T, and the fourth bonding surface 508T are substantially coplanar with each other.

FIG. 3B is a schematic cross-sectional view along the line X-X' of a pixel structure 550b of the light-emitting diode device shown in FIG. 2 in accordance with some embodiments of the disclosure, and the reference numbers the same or similar as those previously described with reference to FIGS. 1, 2, and 3A denote the same or similar elements. As shown in FIG. 3B, the difference between the pixel structure 550b and the pixel structure 550a of the light-emitting diode 500 is that the pixel structure 550b further includes a distributed Bragg reflector 418 to increase the luminous efficiency of the light-emitting diode 500. The distributed Bragg reflector 418 may be sandwiched between the passivation layer 424 and the first light-emitting diode chip 200, the second light-emitting diode chip 300 and the third light-emitting diode chip 400. In some embodiments, the distributed Bragg reflector 418 conformally covers the sidewalls 205 of the first light-emitting diode chip 200, the sidewalls 305 of the second light-emitting diode chip 300 and the sidewalls 405 of the third light-emitting diode chip 400. In addition, the distributed Bragg reflector 418 covers a portion of the top surface 203 of the first light-emitting diode chip 200 not covered by the first electrode 210 and the second electrode 212, and a portion of the top surface 303 of the second light-emitting diode chip 300 not covered by the first electrode 310 and the second electrode 312. Additionally, the distributed Bragg reflector 418 is in contact with the first circuit layer 502, the second circuit layer 504, the third circuit layer 506 and the fourth circuit layer 508. In some embodiments, the distributed Bragg reflector 418 is composed of a stack of alternating two or more thin films of homogeneous or heterogeneous materials with different refractive indices. For example, the distributed Bragg reflector layer 418 may be composed of a stack of alternating silicon dioxide ($SiO_2$) layers and titanium dioxide ($TiO_2$) layers, a stack of alternating silicon dioxide ($SiO_2$) layers, aluminum oxide ($Al_2O_3$) layers and titanium dioxide ($TiO_2$) layers, or a stack of alternating titanium dioxide ($TiO_2$) layers, silicon dioxide ($SiO_2$) layers and tantalum pentoxide ($Ta_2O_5$) layers. In some embodiments, the distributed Bragg reflector layer 418 is formed by deposition processes such as evaporation, atomic layer deposition (ALD), metal organic vapor chemical deposition (MOCVD), and a subsequent patterning process.

Figure 4A:
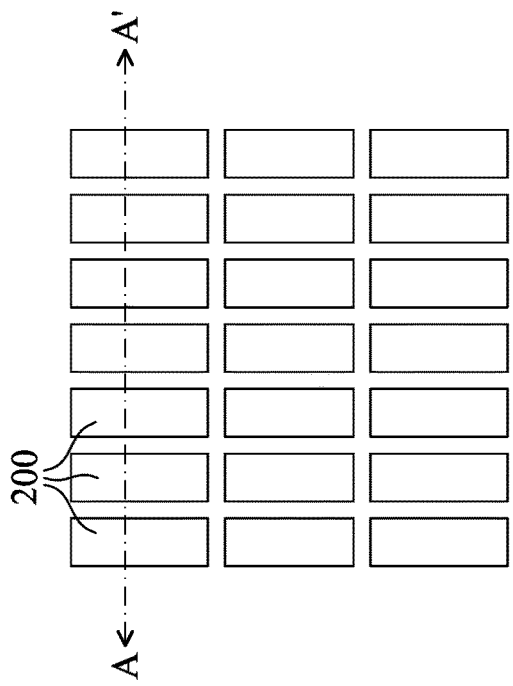
FIGS. 4A, 5A, 6A, and 7A are schematic top views at different stages of forming the light-emitting diode device shown in FIG. 1 in accordance with some embodiments of the disclosure.
Figure 4B:
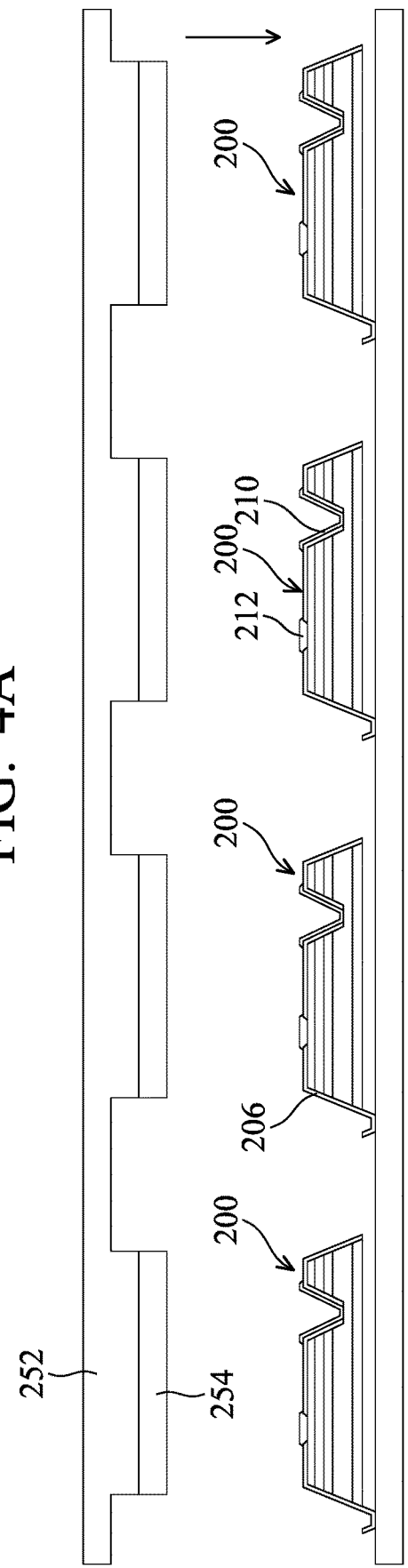
FIGS. 4B, 5B and 6B are cross-sectional views along the line A-A' of FIGS. 4A, 5A and 6A, respectively, showing the cross-sectional views at different stages of forming the light-emitting diode device shown in FIG. 1 in accordance with some embodiments of the disclosure.
Figure 5A:
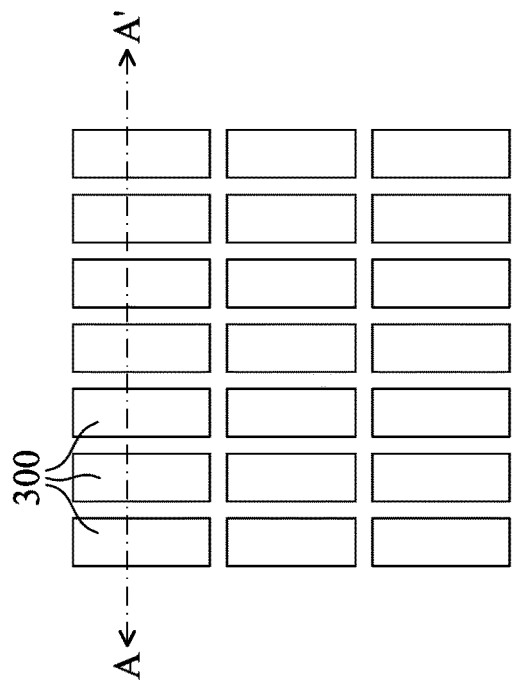
Figure 5B:
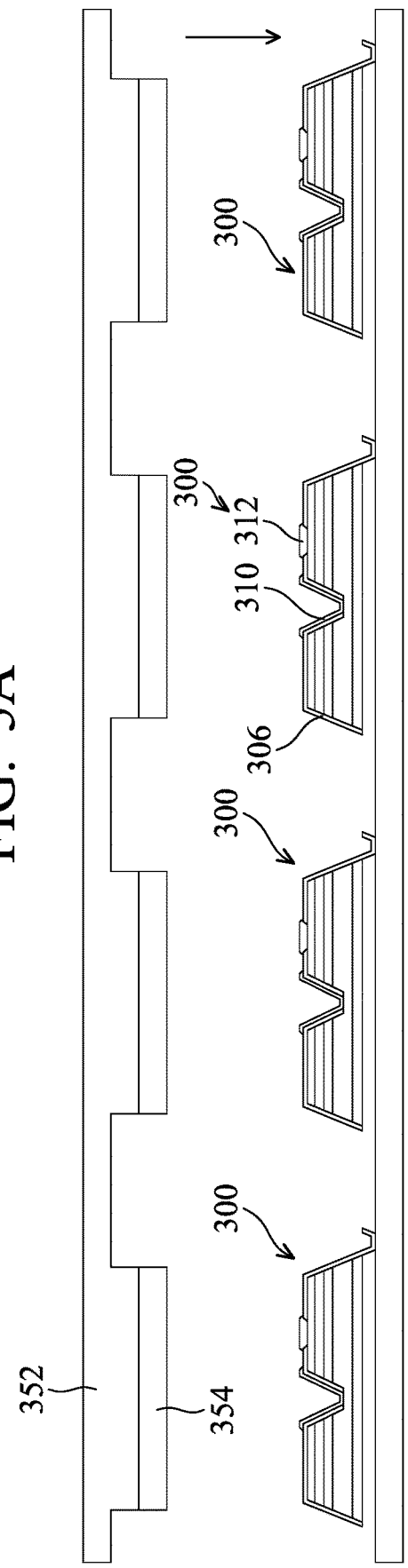
Figure 6A:
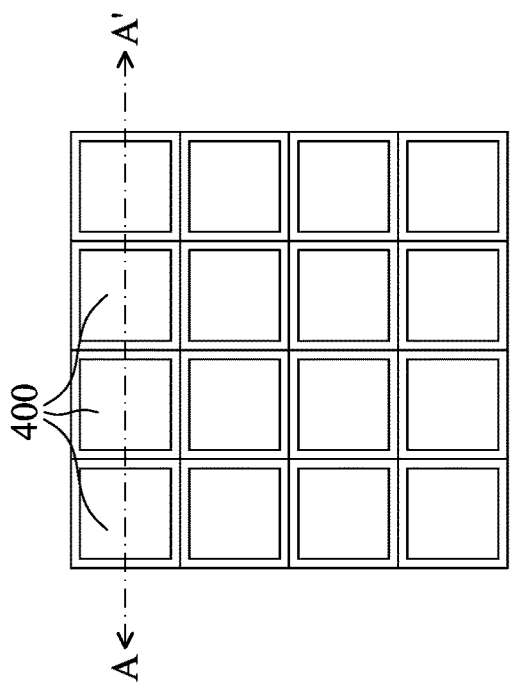
Figure 6B:
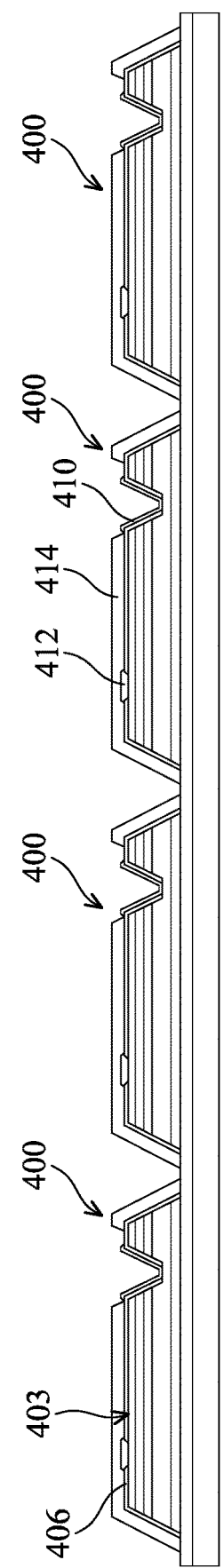
Figures 7A, 7B:
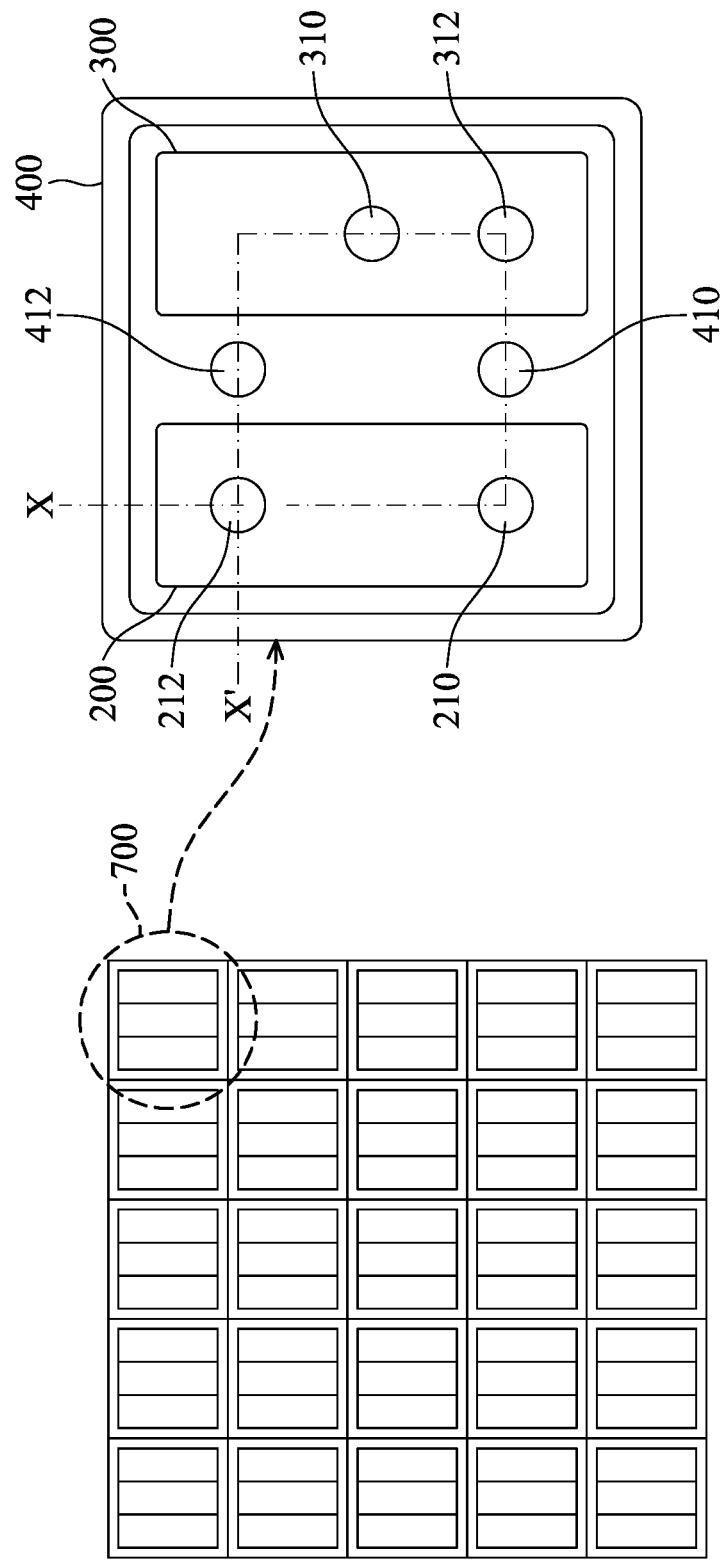
FIG. 7B is an enlarged schematic view of FIG. 7A, which shows the arrangements of light-emitting diode chips in a pixel structure at intermediate steps of forming the light-emitting diode device in accordance with some embodiments of the disclosure.
Figure 7C:
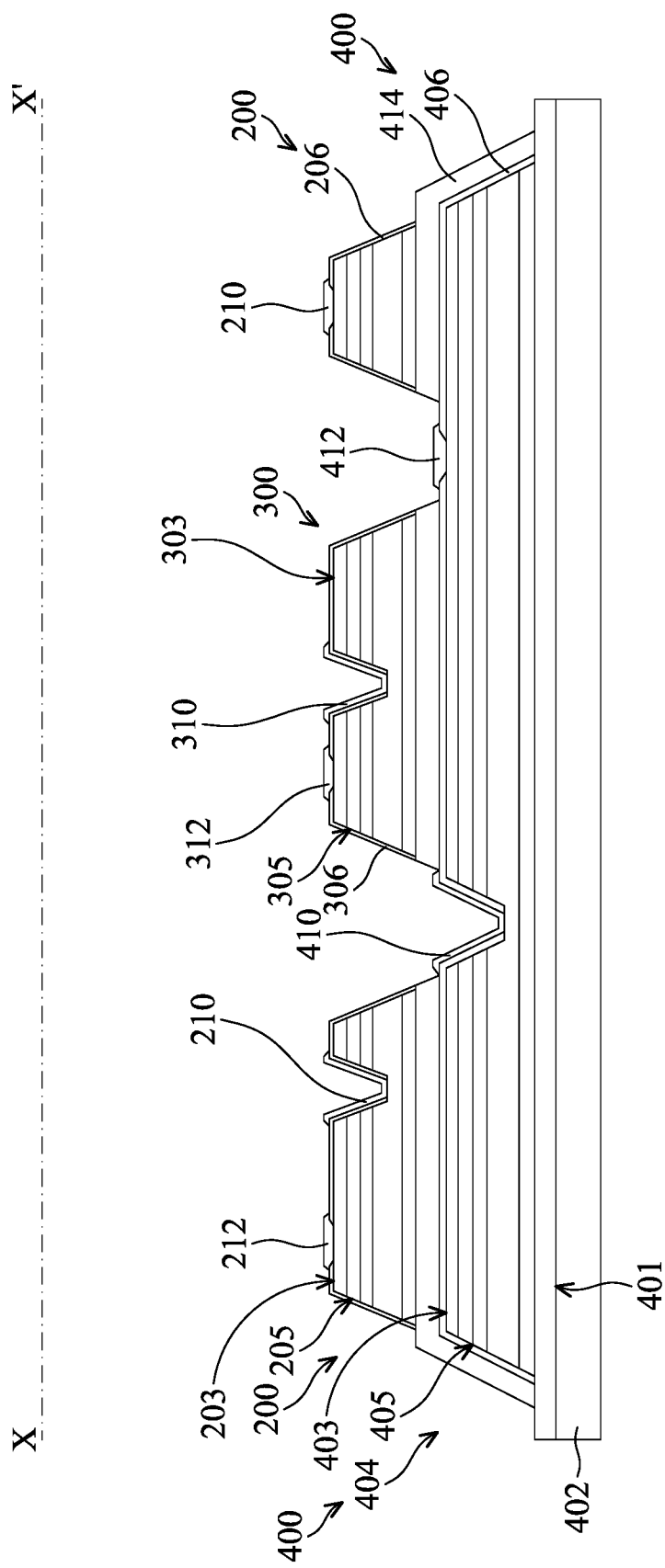
FIGS. 7C and 8 are schematic cross-sectional views along the line X-X' of FIG. 7B, showing the cross-sectional views at different stages of forming the light-emitting diode device shown in FIG. 1 in accordance with some embodiments of the disclosure.

A method for forming the light-emitting diode device 500 will be described below. FIGS. 4A, 5A, 6A and 7A are schematic top views at different stages of forming the light-emitting diode device 500 shown in FIG. 1 in accordance with some embodiments of the disclosure. FIGS. 4B, 5B and 6B are cross-sectional views along the line A-A' of FIGS. 4A, 5A and 6A, respectively, showing the cross-sectional views at different stages of forming the light-emitting diode device 500 shown in FIG. 1 in accordance with some embodiments of the disclosure. FIG. 7B is an enlarged schematic view of a pixel region 700 of FIG. 7A, which shows the arrangements of the first light-emitting diode chip 200, the second light-emitting diode chip 300 and the third light-emitting diode chip 400 in the pixel structure 550 at intermediate steps of forming the light-emitting diode device 500 in accordance with some embodiments of the disclosure. FIG. 7C is a schematic cross-sectional view along the line X-X' of FIG. 7B, showing the cross-sectional views at different stages of forming the light-emitting diode device 500 shown in FIG. 1 in accordance with some embodiments of the disclosure. The reference numbers the same or similar as those previously described with reference to FIGS. 1, 2, 3A and 3B denote the same or similar elements. FIGS. 4A, 5A, 6A and 7A only show the first light-emitting diode chip 200, the second light-emitting diode chip 300 and the third light-emitting diode chip 400 for illustration, the remaining features (including the carriers 250 and 350, the native substrate 402, the first electrodes 210, 310 and 410, the second electrodes 212, 312 and 412, transfer devices 252 and 352, the insulating layer 406 and a transparent bonding layer 414) may be shown in the schematic cross-sectional view shown in FIGS. 4B, 5B, 6B, and 7C.

Referring to FIGS. 4A, 4B, 5A, 5B, 6A and 6B, which respectively provide the first light-emitting diode chips 200 arranged on the carrier 250 in an array, the second light-emitting diode chips 300 on the carrier 350 in an array, and the third light-emitting diode chips 400 grown on the native substrate 402 in an array. In some embodiments, the spacing between two adjacent first light-emitting diode chips 200, the spacing between two adjacent second light-emitting diode chips 300, and the spacing between two adjacent third light-emitting diode chips 400 may be the same or different from one another.

A mass transfer process such as stamp transferring can be performed by using the transfer devices 252 and 352 to transfer the selected first light-emitting diode chips 200 and second light-emitting diode chips 300 to the corresponding positions of the third light-emitting diode chips 400. As shown in FIGS. 4A, 4B, 5A and 5B, the downward pressure (illustrated as the downward arrows in FIGS. 4B, 5B) is applied to the light-emitting diode chips respectively by the transfer devices 252 and 352. Transposition heads 254 and 354 of the transfer devices 252 and 352 (such as polydimethylsiloxane (PDMS) transposition heads) can selectively adsorb any number of the first light-emitting diode chips 200 and the second light-emitting diode chips 300 on the carriers 250 and 350. The selected first light-emitting diode chips 200 and the selected second light-emitting diode chips 300 adsorbed to the transposition heads 254 and 354 are transferred to the corresponding positions of the third light-emitting diode chips 400, and are in contact with the transparent bonding layer 414 to mount on the third light-emitting diode chips 400. For example, the selected first light-emitting diode chip 200 and the selected second light-emitting diode chip 300 may be selectively adsorbed (for example, every other, every second, or other selective methods) and arranged on the top surface 403 of the third light-emitting diode chip 400 according to the spacing of the array of the third light-emitting diode chips 400 and the corresponding positions of the third light-emitting diode chips 400 for the selected first light-emitting diode chip 200 and the selected second light-emitting diode chip 300. Therefore, a single first light-emitting diode chip 200 and a single second light-emitting diode chip 300 are arranged side by side on a single third light-emitting diode chip 400 in each pixel area 700, as shown in FIGS. 7A, 7B, and 7C.

Figure 8:
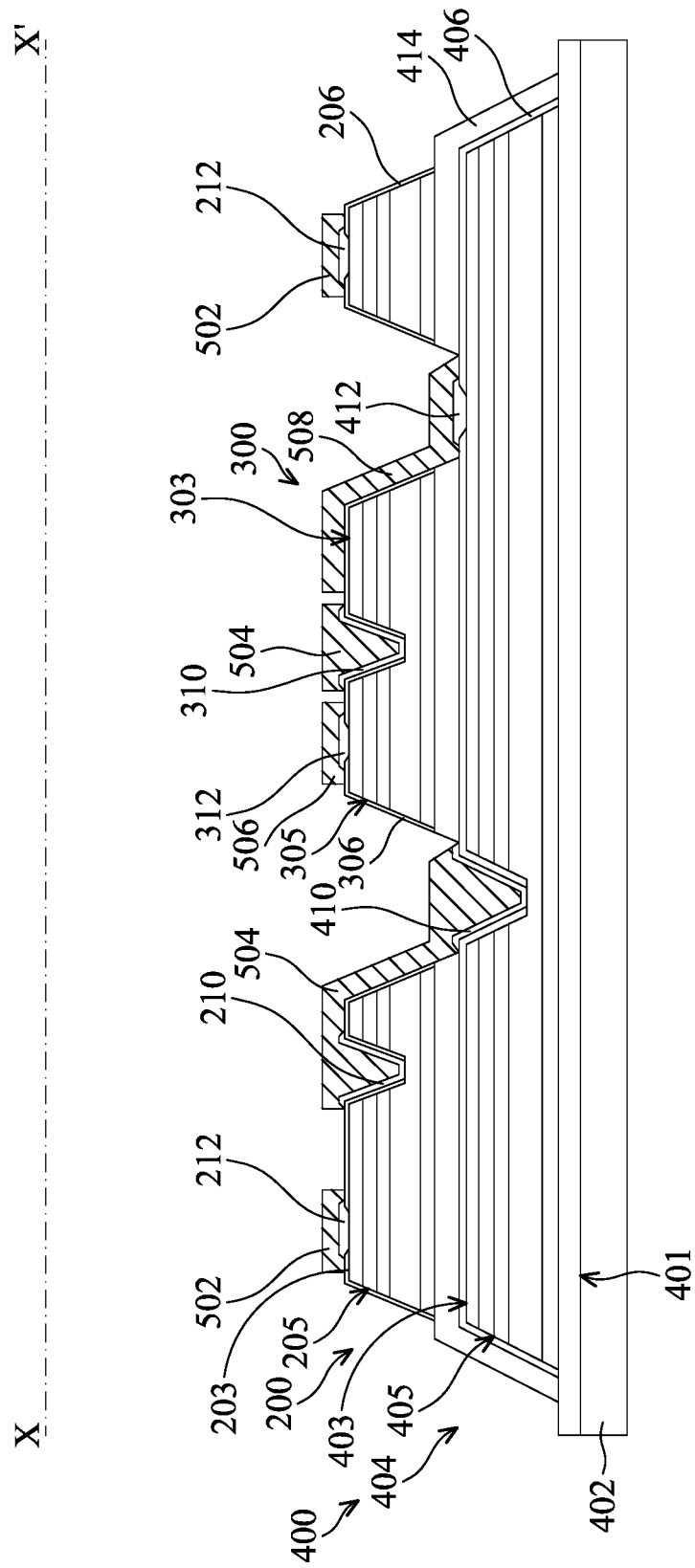

Next, as shown in FIG. 8, a deposition process and a subsequent patterning process are performed to form the first circuit layer 502, the second circuit layer 504, the third circuit layer 506 and the fourth circuit layer 508 which are separated from each other on the first light-emitting diode chip 200, the second light-emitting diode chip 300 and the third light-emitting diode chip 400. The first circuit layer 502 covers a portion of the top surface 203 of the first light-emitting diode chip 200 and is electrically connected to the second electrode 212 of the first light-emitting diode chip 200. The second circuit layer 504 extends from a portion of the top surface 203 and the sidewall 205 of the first light-emitting diode chip 200 to cover a portion of the top surface 403 of the third light-emitting diode chip 400 and a portion of the top surface 303 and the sidewall 305 of the second light-emitting diode chip 300. In addition, the second circuit layer 504 is electrically connected to the first electrode 210 of the first light-emitting diode chip 200, the first electrode 310 of the second light-emitting diode chip 300 and the first electrode 410 of the third light-emitting diode chip 400 simultaneously. The third circuit layer 506 is electrically connected to the second electrode 312 of the second light-emitting diode chip 300. The fourth circuit layer 508 is electrically connected to the second electrode 412 of the third light-emitting diode chip 400 and extends to cover a portion of the top surface 403 of the third light-emitting diode chip 400.

Next, as shown in FIG. 3A, a coating process and a subsequent patterning process are performed to form the passivation layer 424 covering the first light-emitting diode chip 200, the second light-emitting diode chip 300 and the third light-emitting diode chip 400. The passivation layer 424 covers a portion of the first circuit layer 502, the second circuit layer 504, the third circuit layer 506 and the fourth circuit layer 508. The passivation layer 424 has openings to define positions of the first bonding surface 502T of the first circuit layer 502, the second bonding surface 504T of the second circuit layer 504, the third bonding surface 506T of the third circuit layer 506, and the fourth bonding surface 508T of the fourth circuit layer 508. After performing the aforementioned processes, an array is formed by the light-emitting diode devices 500 including the pixel structures 550a in accordance with some embodiments of the disclosure.

In some embodiments of the disclosure, after performing processes similar to those shown in FIGS. 7A-7C, a deposition process and a subsequent patterning process are performed to form the distributed Bragg reflector 418 on the first light-emitting diode chip 200, the second light-emitting diode chip 300 and the third light-emitting diode chip 400, as shown in FIG. 3B. The distributed Bragg reflector 418 extends from the sidewall 405 of the third light-emitting diode chip 400 to cover the sidewall 205 and a portion of the top surface 203 of the first light-emitting diode chip 200 and the sidewall 305 and a portion of the top surface 303 of the second light-emitting diode chip 300 above the third light-emitting diode chip 400. Therefore, the first electrode 210 and the second electrode 212 of the first light-emitting diode chip 200 and the first electrode 310 and the second electrode 312 of the second light-emitting diode chip 300 are exposed from the distributed Bragg reflector 418. In some embodiments, the distributed Bragg reflector 418 may be formed before the formation of the first circuit layer 502, the second circuit layer 504, the third circuit layer 506, and the fourth circuit layer 508. In other embodiments, the distributed Bragg reflector 418 may be formed after forming the first circuit layer 502, the second circuit layer 504, the third circuit layer 506, and the fourth circuit layer 508. After performing the aforementioned processes, an array is formed by the light-emitting diode devices 500 including the pixel structures 550b in accordance with some embodiments of the disclosure.

Figure 9B:
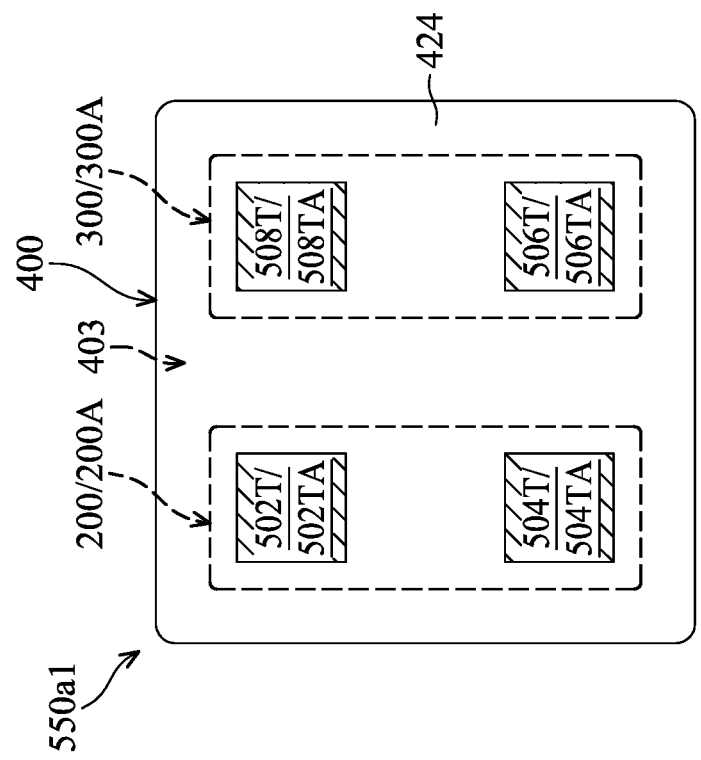
FIGS. 9A and 9B are schematic top views of the light-emitting diode device in accordance with some embodiments of the disclosure, showing the arrangements of light-emitting diode chips, circuit layers, bonding surfaces and passivation layers of the light-emitting diode device.
Figure 9A:
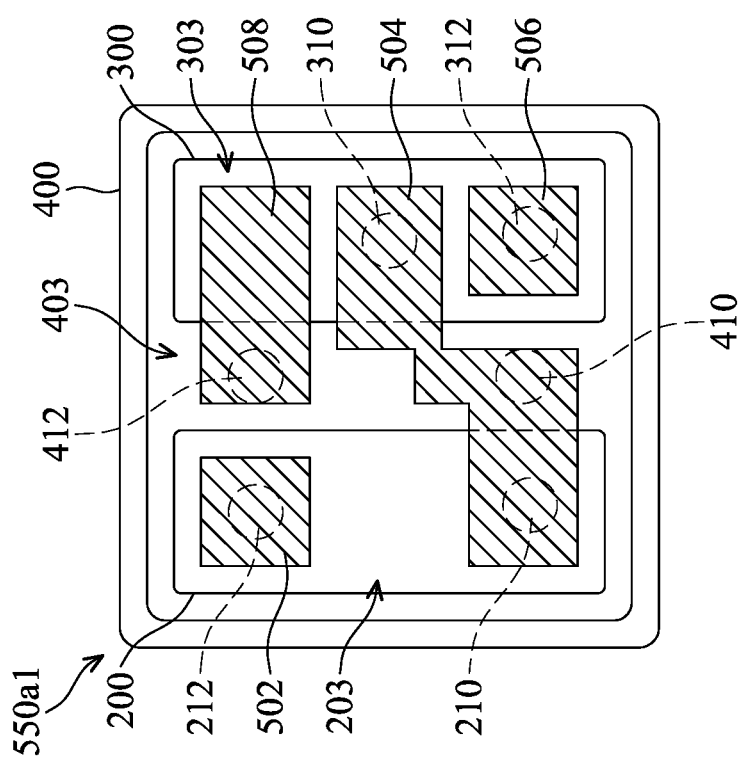

FIGS. 9A and 9B are schematic top views of a pixel structure 550a1 of the light-emitting diode device 500 in accordance with some embodiments of the disclosure. FIG. 9A shows the arrangements of the first light-emitting diode chip 200, the second light-emitting diode chip 300, the third light-emitting diode chip 400 and the first circuit layer 502, the second circuit layer 504, the third circuit layer 506 and the fourth circuit layer 508 in the pixel structure 550a1. FIG. 9B shows the arrangements of the first bonding surface 502T of the first circuit layer 502, the second bonding surface 504T of the second circuit layer 504, the third bonding surface 506T of the third circuit layer 506, the fourth circuit layer 508 and the passivation layer 424 in the pixel structure 550a1.

As shown in FIG. 9A, in some embodiments, the first circuit layer 502 electrically connected to the second electrode 212 and the second circuit layer 504 electrically connected to the first electrodes 210, 310 and 410 are respectively disposed on the top surface 203 of the first light-emitting diode chip 200 and away from the third light-emitting diode chip 400. In addition, the second circuit layer 504 extends to cover the top surface 303 of the second light-emitting diode chip 300 and the top surface 403 of the third light-emitting diode chip 400. The third circuit layer 506 electrically connected to the second electrode 312 and the fourth circuit layer 508 electrically connected to the second electrode 412 are both disposed on the top surface 303 of the second light-emitting diode chip 300 and away from the third light-emitting diode chip 400. In addition, the fourth circuit layer 508 extends to cover the top surface 403 of the third light-emitting diode chip 400.

As shown in FIG. 9B, in some embodiments, the vertical projections 502TA and 504TA of the first bonding surface 502T and the second bonding surface 504T corresponding to the openings in the passivation layer 424 are located within the first vertical projection 200A. In addition, the vertical projections 506TA and 508TA of the third bonding surface 506T and the fourth bonding surface 508T corresponding to the openings in the passivation layer 424 are located within the second vertical projection 300A. Further, the first bonding surface 502T, the second bonding surface 504T, the third bonding surface 506T and the fourth bonding surface 508T are respectively close to the four corners of the pixel structure 550a1.

Figure 10B:
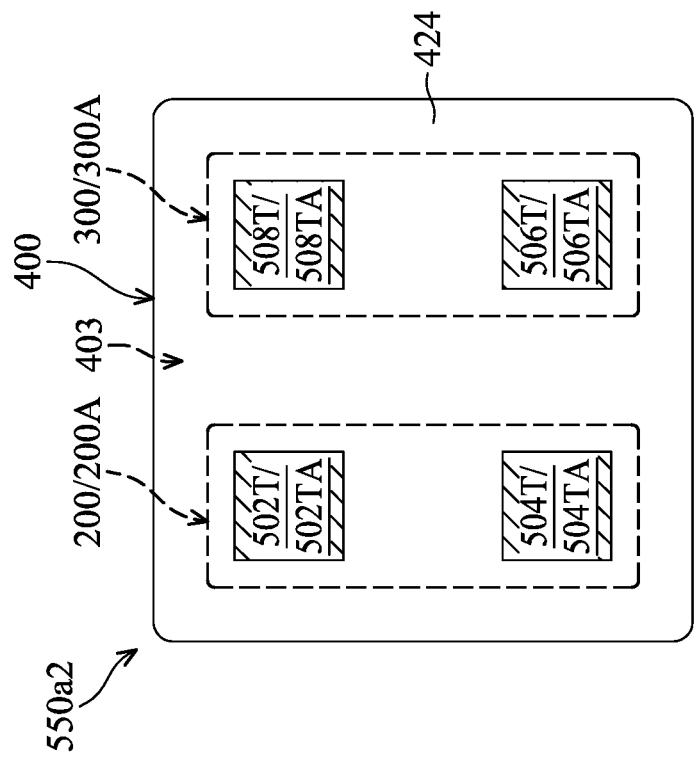
FIGS. 10A and 10B are schematic top views of the light-emitting diode device in accordance with some embodiments of the disclosure, showing the arrangements of light-emitting diode chips, circuit layers, bonding surfaces and passivation layers of the light-emitting diode device.
Figure 10A:
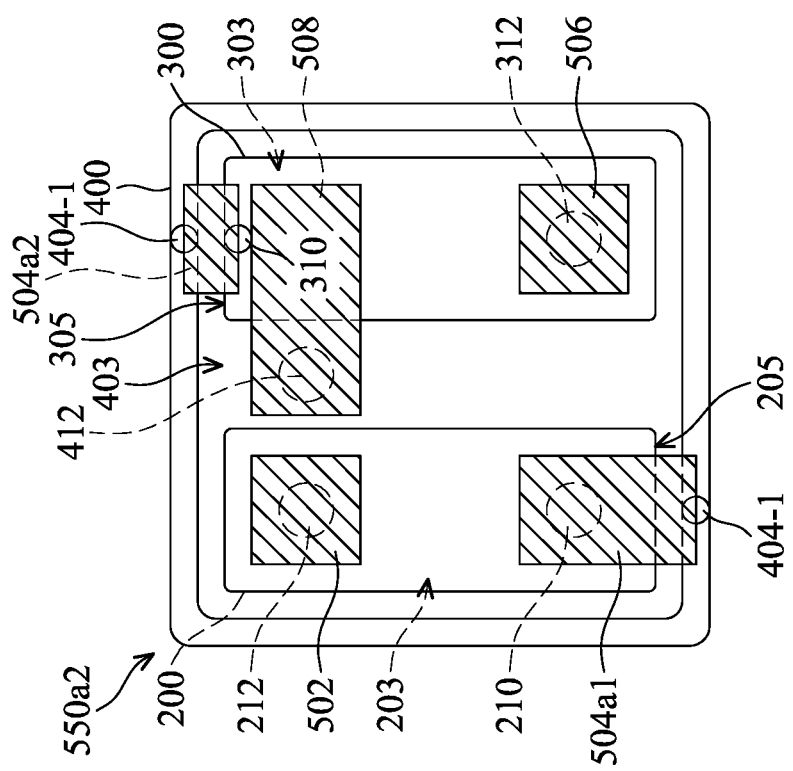

In some embodiments, as FIG. 3A shows, the semiconductor epitaxial stack structure 404 includes a first conductivity type semiconductor layer, a second conductivity type semiconductor layer and a light-emitting layer. Because the first conductivity type semiconductor layer (such as the first conductivity type semiconductor layer 404-1 shown in FIG. 10A) of the semiconductor epitaxial stack structure 404 of the third light-emitting diode chip 400 is uncovered, how the common electrode circuit layer (such as the second circuit layer 504 shown in FIG. 9A) connecting electrodes can be changed. For example, the first electrode 210 of the first light-emitting diode chip 200 and the first electrode 310 of the second light-emitting diode chip 300 are electrically connected to the first conductivity type semiconductor layer 404-1 (FIG. 10A) of the third light-emitting diode chip 400 so the first conductivity type semiconductor layer 404-1 (FIG. 10A) can replace the first electrode 410 of the third light-emitting diode chip 400 through different circuit layers. FIGS. 10A and 10B are schematic top views of a pixel structure 550a2 of the light-emitting diode device 500 in accordance with some embodiments of the disclosure. FIG. 10A shows a top view of a pixel structure 550a2 including the first light-emitting diode chip 200, the second light-emitting diode chip 300, the third light-emitting diode chip 400, the first circuit layer 502 and a second circuit layer 504a1, the third circuit layer 506, the fourth circuit layer 508 and a fifth circuit layer 504a2. FIG. 10B shows a top view of the pixel structure 550a2 including the first bonding surface 502T of the first circuit layer 502, the second bonding surface 504T of the second circuit layer 504a1, the third bonding surface 506T of the third circuit layer 506, the fourth bonding surface 508T of the fourth circuit layer 508 and the passivation layer 424. The reference numbers the same or similar as those previously described with reference to FIGS. 9A and 9B denote the same or similar elements. As shown in FIG. 10A, the difference between the pixel structure 550a2 of the light-emitting diode device 500 and the pixel structure 550a1 is that the first electrode 210 of the first light-emitting diode 200 and the first electrode 310 of the second light-emitting diode chip 300 of the pixel structure 550a2 are respectively electrically connected to the first conductivity type semiconductor layer 404-1 of the semiconductor epitaxial stack structure 404 (please refer to FIG. 3A, the semiconductor epitaxial stack structure 404 includes the first conductivity type semiconductor layer, the second conductivity type semiconductor layer and the light-emitting layer) of the third light-emitting diode chip 400 using the second circuit layer 504a1 and the fifth circuit layer 504a2. In some embodiments, the fifth circuit layer 504a2 is disposed on the top surface 303 of the second light-emitting diode chip 300 and extends to cover the sidewall 305 of the second light-emitting diode chip 300 and the third light-emitting diode chip 400. In some embodiments, the fifth circuit layer 504a2 is electrically connected to the first electrode 310 of the second light-emitting diode chip 300 and the first conductivity type semiconductor layer 404-1 of the third light-emitting diode chip 400. The second circuit layer 504a1 extends to the sidewall 205 of the first light-emitting diode chip 200 and the third light-emitting diode chip 400, and is electrically connected to the first electrode 210 of the first light-emitting diode chip 200 and the first conductivity type semiconductor layer 404-1 of the third light-emitting diode chip 400. In addition, the second bonding surface 504T of the pixel structure 550a2 is located on the second circuit layer 504a1. Therefore, as shown in FIG. 10B, the first bonding surface 502T, the second bonding surface 504T, the third bonding surface 506T and the fourth bonding surface 508T are still close to the four corners of the pixel structure 550a2, respectively.

Figure 11B:
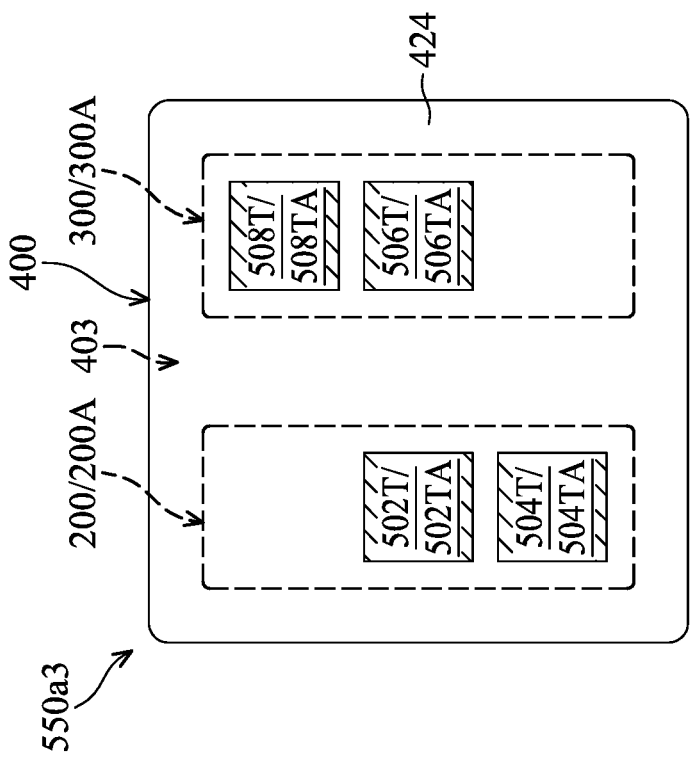
FIGS. 11A and 11B are schematic top views of the light-emitting diode device in accordance with some embodiments of the disclosure, showing the arrangements of light-emitting diode chips, circuit layers, bonding surfaces and passivation layers of the light-emitting diode device.
Figure 11A:
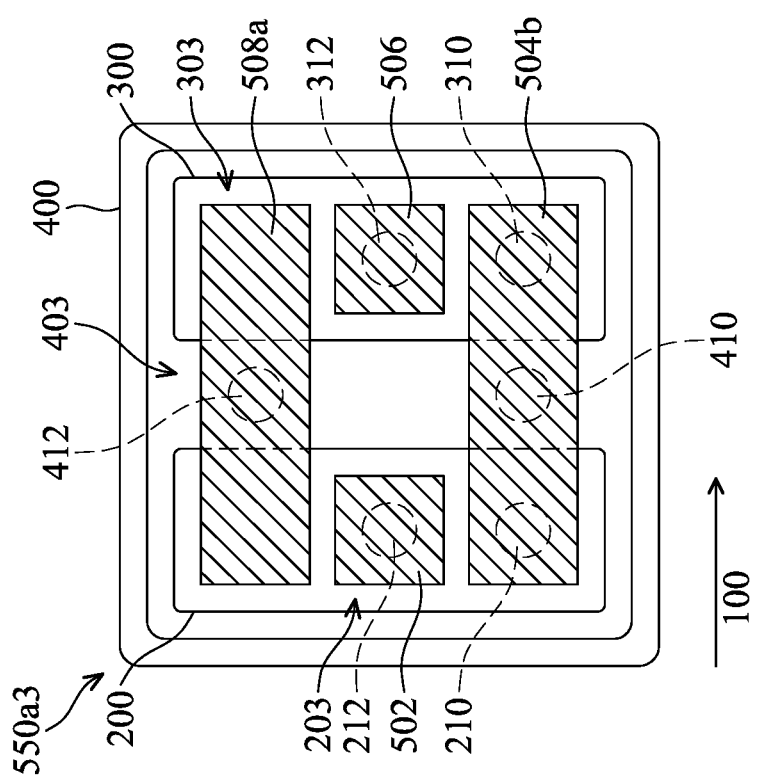

In some embodiments, the positions of the four bonding surfaces of the light-emitting diode device 500 may be changed correspondingly according to the arrangement positions of the first electrodes and the second electrodes of the light-emitting diode chips. FIGS. 11A and 11B are schematic top views of a pixel structure 550a3 of the light-emitting diode device 500 in accordance with some embodiments of the disclosure. FIG. 11A shows the arrangements of the first light-emitting diode chip 200, the second light-emitting diode chip 300, the third light-emitting diode chip 400, the first circuit layer 502, a second circuit layer 504b, the third circuit layer 506 and a fourth circuit layer 508a in the pixel structure 550a3. FIG. 11B shows the arrangements of the first bonding surface 502T of the first circuit layer 502, the second bonding surface 504T of the second circuit layer 504b, the third bonding surface 506T of the third circuit layer 506, the fourth bonding surface 508T of the fourth circuit layer 508a and the passivation layer 424 in the pixel structure 550a3. The reference numbers the same or similar as those previously described with reference to FIGS. 9A, 9B, 10A and 10B denote the same or similar elements. As shown in FIG. 11A, the difference between the pixel structure 550a3 and the pixel structure 550a1 of the light-emitting diode 500 is that the first electrode 310 of the second light-emitting diode chip 300, the first electrode 210 of the first light-emitting diode chip 200 and the first electrode 410 of the third light-emitting diode 400 of the pixel structure 550a3 are arranged side by side along a direction 100, for example, substantially perpendicular to the long axis direction of the first light-emitting diode chip 200 and the second light-emitting diode chip 300. Therefore, the second circuit layer 504b of the pixel structure 550a3 extends along the direction 100 from the top surface 203 of the first light-emitting diode chip 200 to cover the top surface 403 of the third light-emitting diode chip 400 and the top surface 303 of the second light-emitting diode chip 300. In addition, in the top view as shown in FIG. 11A, the second circuit layer 504b is substantially strip shape, and the two ends of the second circuit layer 504b are respectively located on end portions of the first light-emitting diode chip 200 and the second light-emitting diode chip 300. The third circuit layer 506 of the pixel structure 550a3 is located in a middle portion of the third circuit layer 506. The fourth circuit layer 508a of the pixel structure 550a3 extends along the direction 100 from the second light-emitting diode chip 300 to cover the top surface 403 of the third light-emitting diode chip 400 and the top surface 203 of the first light-emitting diode chip 200. In addition, in the top view as shown in FIG. 11A, the fourth circuit layer 508a is substantially strip shape, and the two ends are respectively located on end portions of the first light-emitting diode chip 200 and the second light-emitting diode chip 300. As shown in FIG. 11B, the first bonding surface 502T and the third bonding surface 506T of the pixel structure 550a3 correspond to the middle portions of the first light-emitting diode chip 200 and the second light-emitting diode chip 300, respectively. The second bonding surface 504T and the fourth bonding surface 508T of the pixel structure 550a3 are respectively close to the diagonal corners of the pixel structure 550a3.

In some embodiments, a first light-emitting diode chip 200a and a second light-emitting diode chip 300a of different sizes can be used and arranged with the circuit layers, so that the four different bonding surfaces are respectively close to the four corners of the pixel structure. FIGS. 12A and 12B are schematic top views of a pixel structure 550a4 of the light-emitting diode device 500 in accordance with some embodiments of the disclosure. FIG. 12A shows the arrangements of the first light-emitting diode chip 200a, the second light-emitting diode chip 300a, the third light-emitting diode chip 400, the first circuit layer 502, a second circuit layer 504c, the third circuit layer 506 and a fourth circuit layer 508b in the pixel structure 550a4. FIG. 12B shows the arrangements of the first bonding surface 502T of the first circuit layer 502, the second bonding surface 504T of the second circuit layer 504c, the third bonding surface 506T of the third circuit layer 506, the fourth bonding surface 508T of the fourth circuit layer 508b and the passivation layer 424 in the pixel structure 550a4. The reference numbers the same or similar as those previously described with reference to FIGS. 9A, 9B, 10A, 10B, 11A and 11B denote the same or similar elements. As shown in FIG. 12A, the difference between the pixel structure 550a4 and the pixel structure 550a1 of the light-emitting diode 500 is that the sizes of the first light-emitting diode chip 200a and the second light-emitting diode chip 300a of the pixel structure 550a4 are smaller than those of the first light-emitting diode chip 200 and the second light-emitting diode chip 300 shown in FIGS. 9A and 9B, respectively. Therefore, the line width of the portion of the second circuit layer 504c that is electrically connected to the first electrodes 210, 310 and 410 is smaller than the line width of the portion of the second circuit layer 504c that is close to the corner of the pixel structure 550a4. Moreover, the line width of the portion of the fourth circuit layer 508b that is electrically connected to the second electrode 412 is smaller than the line width of the portion of the fourth circuit layer 508b that is close to the corner of the pixel structure 550a4. As shown in FIG. 12B, in some embodiments, the vertical projections 502TA and 508TA of the first bonding surface 502T and the fourth bonding surface 508T corresponding to the openings in the passivation layer 424 are both partially located within the first vertical projection 200aA. The vertical projections 504TA and 506TA of the second bonding surface 504T and the third bonding surface 506T corresponding to the openings in the passivation layer 424 are both partially located in the second vertical projection 300aA. Portions of the first bonding surface 502T and the fourth bonding surface 508T within the first vertical projection 200A are coplanar with portions of the second bonding surface 504T and the third bonding surface 506T within the second vertical projection 300aA. Moreover, the first bonding surface 502T, the second bonding surface 504T, the third bonding surface 506T and the fourth bonding surface 508T are still close to the four corners of the pixel structure 550a4, respectively.

Figure 14:
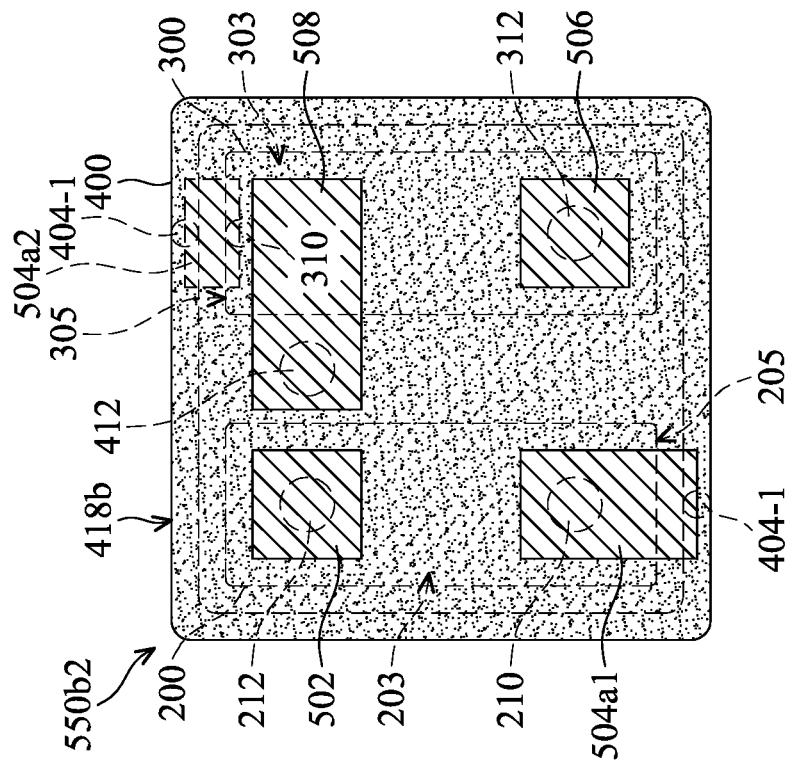
FIGS. 13, 14, 15, and 16 are schematic top views of the light-emitting diode device in accordance with some embodiments of the disclosure, showing the arrangements of light-emitting diode chips, circuit layers, and distributed Bragg reflectors (DBRs) of the light-emitting diode device.
Figure 13:
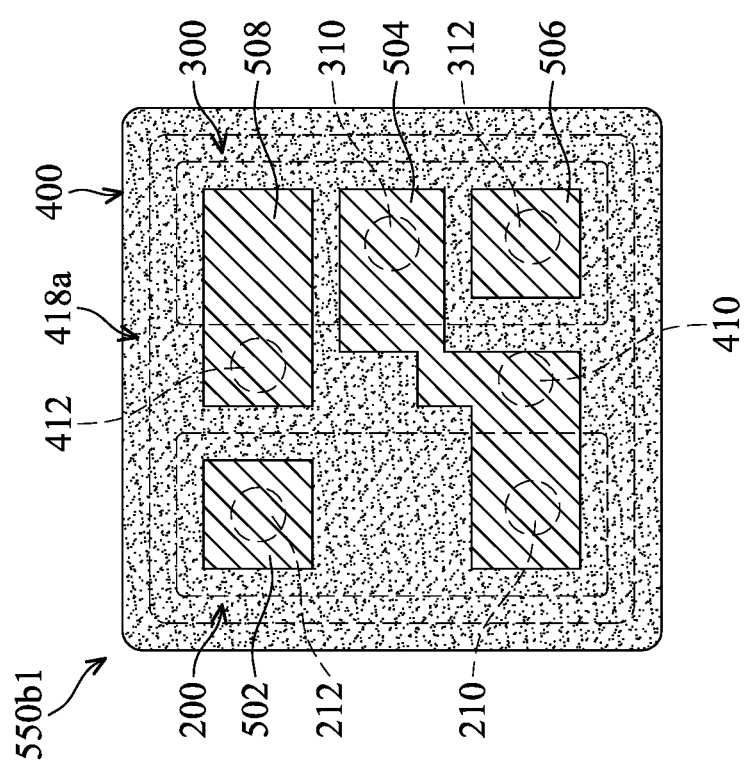
Figures 15, 16:
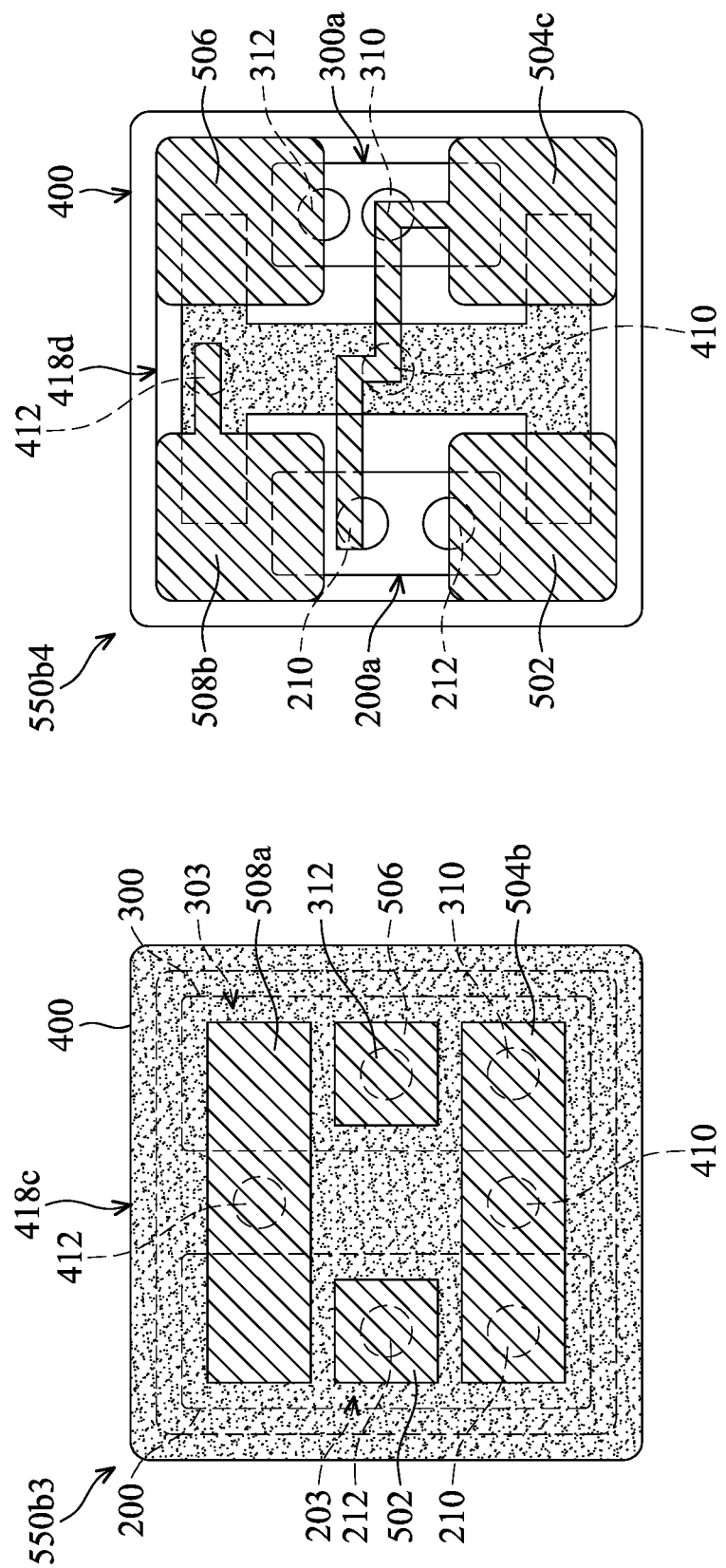

FIGS. 13, 14 and 15 are schematic top views of pixel structures 550b1, 550b2 and 550b3 of the light-emitting diode device 500 in accordance with some embodiments of the disclosure. The differences between the pixel structures 550b1, 550b2 and 550b3 and the pixel structures 550a1, 550a2 and 550a3 are that the pixel structures 550b1, 550b2 and 550b3 further include distributed Bragg reflectors 418a, 418b and 418c, respectively. As shown in FIG. 13, the distributed Bragg reflector 418a of the pixel structure 550b1 is formed after forming the first circuit layer 502, the second circuit layer 504, the third circuit layer 506, and the fourth circuit layer 508. As shown in FIG. 14, the distributed Bragg reflector 418b of the pixel structure 550b2 is formed after forming the first circuit layer 502, the second circuit layer 504a1, the third circuit layer 506, the fourth circuit layer 508 and a fifth circuit layer 504a4. As shown in FIG. 15, the distributed Bragg reflector 418c of the pixel structure 550b3 is formed after forming the first circuit layer 502, the second circuit layer 504b, the third circuit layer 506, and the fourth circuit layer 508a.

FIG. 16 is a schematic top view of the pixel structure 550b4 of the light-emitting diode device 500 in accordance with some embodiments of the disclosure. The difference between the pixel structure 550b4 and the pixel structure 550a4 is that the pixel structure 550b4 further includes a distributed Bragg reflector 418d. As shown in FIG. 16, the distributed Bragg reflector 418d of the pixel structure 550b4 is formed before the formation of the first circuit layer 502, the second circuit layer 504c, the third circuit layer 506, and the fourth circuit layer 508b.

Figure 17:
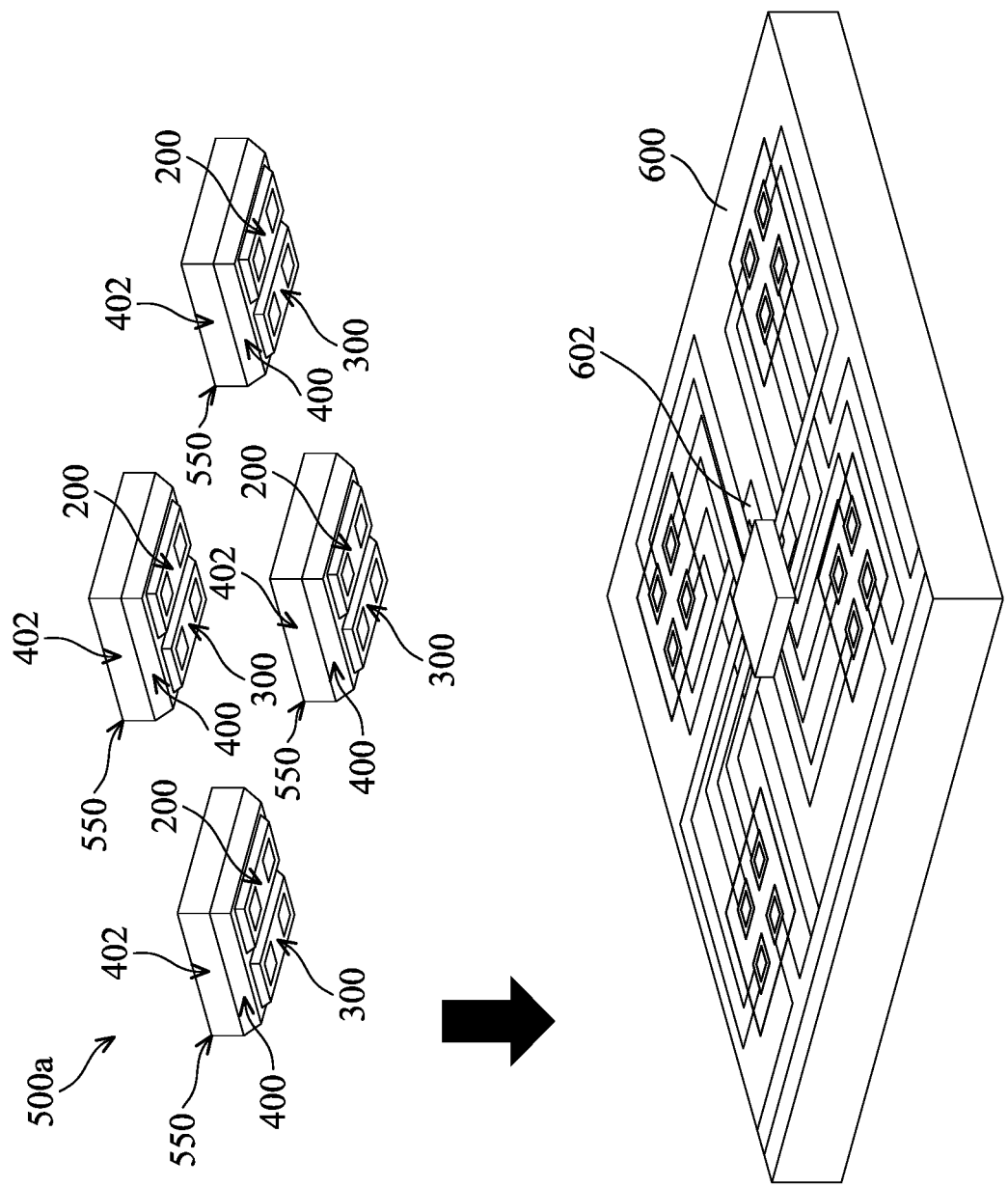
FIG. 17 is a schematic three-dimensional view of the light-emitting diode device in accordance with some embodiments of the disclosure, showing the method of bonding the pixel structure of the light-emitting diode device with a native substrate to a micro-control element and a circuit substrate.

FIG. 17 is a schematic three-dimensional view of a light-emitting diode device 500a in accordance with some embodiments of the disclosure, showing the method of bonding the pixel structures 550 with the native substrates 402 shown in FIG. 3A to a circuit substrate 600 with a micro-control element 602 which comprised multiple LED drivers made of semiconductor. In some embodiments, the light-emitting diode device 500a further includes the circuit substrate 600 and the micro-control element 602 disposed on the circuit substrate 600. For example, the light-emitting diode pixel structure array shown in FIG. 7A is separated into individual pixel structures 550 by a singulation process such as laser cutting. Next, a pick and place process may be performed using a pickup-head such as a thimble to selectively adsorb the individual pixel structures 550 and place them on the circuit substrate 600, so that the first bonding surfaces 502T, the second bonding surfaces 504T, the third bonding surfaces 506T and the fourth bonding surfaces 508T of each of the pixel structures 550 are respectively electrically contact the corresponding pads of the circuit substrate 600. Therefore, the micro-control element 602 of the substrate 600 are electrically connected to the first circuit layers 502, the second circuit layers 504, the third circuit layers 506 and the fourth circuit layers 508 of the pixel structures 550 through the pads and circuit layers of the substrate 600 to control different pixel structures 550, respectively.

FIG. 18 is a schematic three-dimensional view of a light-emitting diode device 500b including the circuit substrate 600 and the micro-control element 602 in accordance with some embodiments of the disclosure, showing the method of bonding a pixel structure 550c formed by removing the native substrate 402 (FIG. 3A) to the circuit substrate 600 and the micro-control element 602. The difference between the light-emitting diode device 500b and the light-emitting diode device 500a is that the third light-emitting diode chip of the light-emitting diode device 500b does not include a native substrate. For example, the light-emitting diode pixel structure array in FIG. 7A is subjected to a substrate removal process such as laser lift-off (LLO) to remove the native substrates 402 of the pixel structure array of the light-emitting diode device 500b and separate into individual pixel structures 550c. Therefore, the size of the pixel structures 550c is further reduced. Next, a mass transfer process such as stamp transfer can be performed, and the individual pixel structures 550c can be selectively adsorbed and disposed on the circuit substrate 600 by using, for example, a polydimethylsiloxane (PDMS) transposition head. The first bonding surface 502T, the second bonding surface 504T, the third bonding surface 506T and the fourth bonding surface 508T (FIG. 2) of the pixel structure 550c respectively electrically contact the corresponding pads of the circuit substrate 600, so that the micro-control element 602 is electrically connected to the first circuit layer 502, the second circuit layer 504, the third circuit layer 506 and the fourth circuit layer 508 of each of the pixel structures 550c through the pads and circuit layers of the circuit substrate 600 to control different pixel structures 550c, respectively.

Figure 19A:
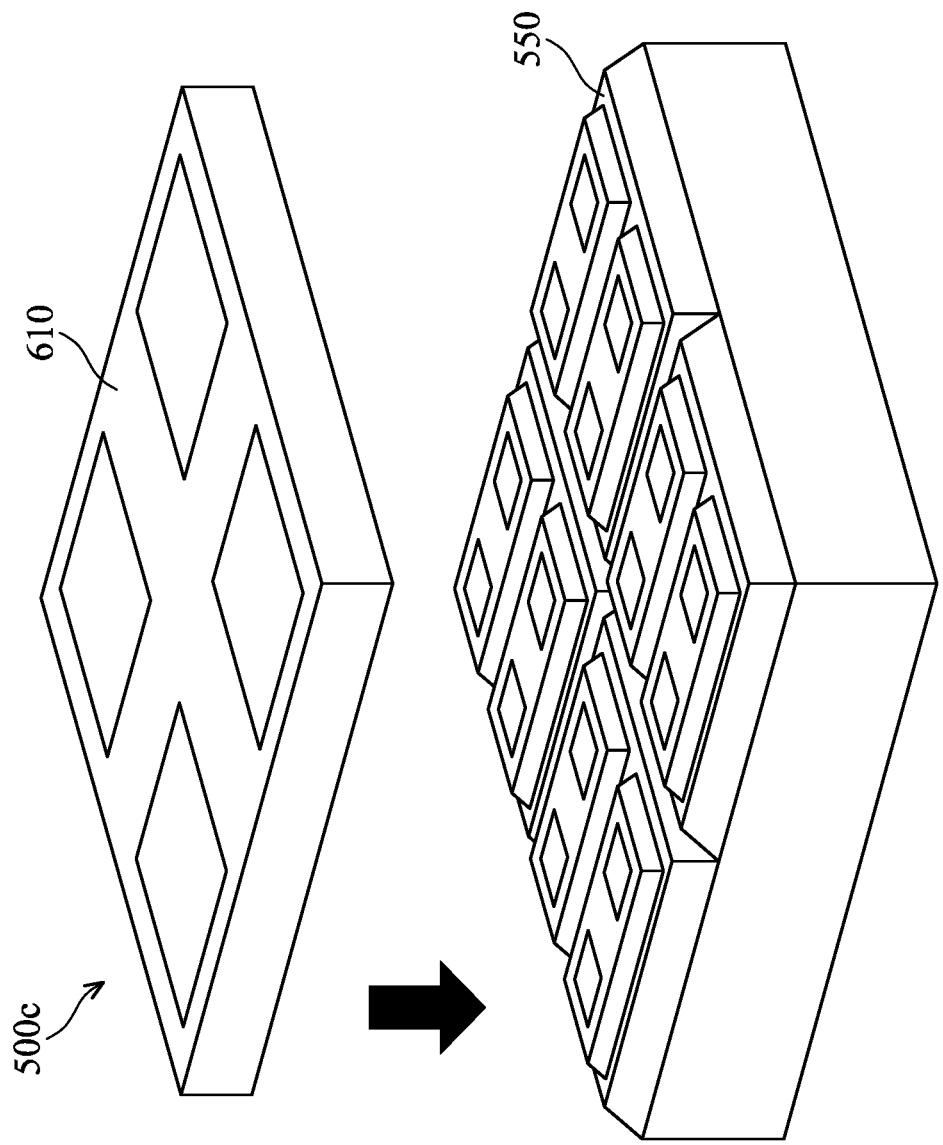
FIGS. 19A, 19B and 19C are schematic three-dimensional views and schematic cross-sectional views of the light-emitting diode device in accordance with some embodiments of the disclosure, showing the method of bonding the pixel structure of the light-emitting diode device without the native substrate to a thin film transistor substrate.
Figure 19B:
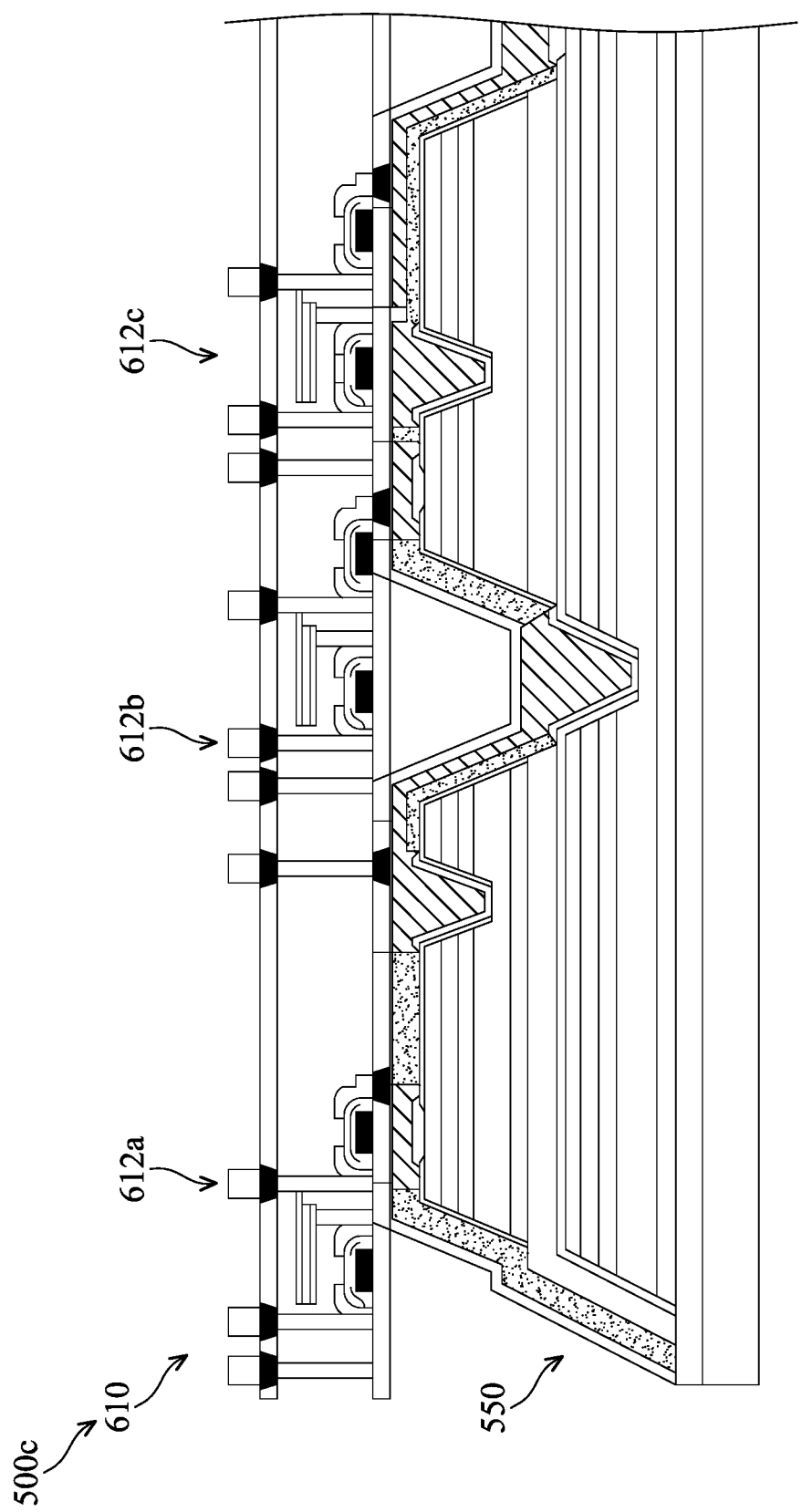
Figure 19C:
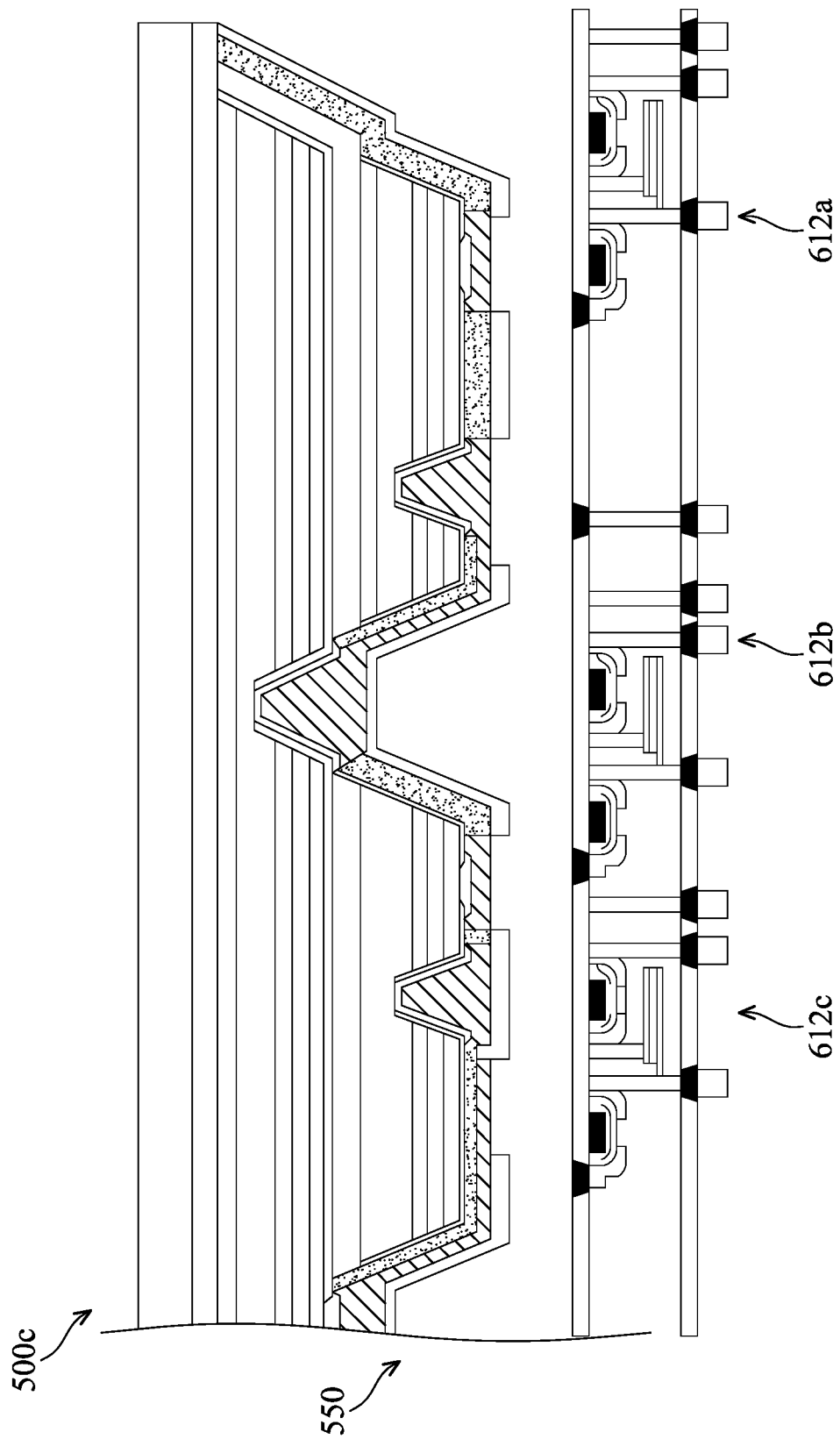

FIGS. 19A, 19B and 19C are schematic three-dimensional views and schematic cross-sectional views of a light-emitting diode device 500c in accordance with some embodiments of the disclosure, showing the method of bonding the pixel structure 550 to a thin film transistor substrate 610. The difference between the light-emitting diode device 500c and the light-emitting diode device 500b is that the pixel structure 550 of the light-emitting diode device 500c is bonded to the thin film transistor substrate 610 to form the light-emitting diode device 500c, for example, a light-emitting diode display device. In some embodiments, the light-emitting diode device 500c further includes the thin film transistor substrate 610 disposed on the pixel structure 550. As shown in FIGS. 19A and 19B, in some embodiments, after the array of pixel structures 550 of the light-emitting diode device 500c is formed, the semiconductor processes are performed to form the thin film transistor substrate 610 on the pixel structures 550. The thin film transistor substrate 610 includes thin film transistors 612a, 612b and 612c and circuits corresponding to each pixel structure 550. The thin film transistors 612a, 612b and 612c and the circuits are electrically connected to the first bonding surfaces 502T of the first circuit layers 502, the second bonding surfaces 504T of the second circuit layers 504, the bonding surfaces 506T of the third circuit layers 506 and the fourth bonding surface 508T of the fourth circuit layers 508 of the corresponding pixel structures 550 to control different pixel structures 550, respectively.

As shown in FIGS. 19A and 19C, in some embodiments, the array of pixel structures 550 may be bonded to the fabricated thin film transistor substrate 610 to form the light-emitting diode device 500c, for example, a light-emitting diode display device. The first bonding surface 502T of the first circuit layer 502, the second bonding surface 504T of the second circuit layer 504, the third bonding surface 506T of the third circuit layer 506, and the fourth bonding surface 508T of the circuit layer 508 of each pixel structure 550 (FIGS. 2 and 3A) of the light-emitting diode device 500c are respectively electrically connected to the corresponding thin film transistors 612a, 612b and 612c and circuits to control different pixel structures 550, respectively.

Embodiments of the present disclosure provide a light-emitting diode device. The light-emitting diode device stacks two mini or micro light-emitting diode chips side by side on the top surface of one light-emitting diode chip to form a single pixel structure, and is arranged with the circuit layer configuration of each light-emitting diode chip. In the three anode bonding surfaces and the common-cathode bonding surface, two of the three anode bonding surfaces are located over one of the side-by-side stacked light-emitting diode chips. The other anode bonding surface and the common-cathode bonding surface are located over another one of the side-by-side stacked light-emitting diode chips. In addition, the light-emitting surface of the light-emitting diode device is opposite the top surface of the lower light-emitting diode chip. In some embodiments, the pixel structure of the light-emitting diode device may be bonded to a circuit substrate with micro-control elements disposed thereon to control different pixel structures respectively. In some embodiments, an array of pixel structures of a light-emitting diode device may be bonded to a thin film transistor substrate to form, for example, a light-emitting diode display device, wherein thin film transistors of the thin film transistor substrate respectively control different pixel structures. The light-emitting diode device in accordance with some embodiments of the disclosure uses a transfer process to stack two micro light-emitting diode chips side by side on another micro light-emitting diode chip or mini light-emitting diode chip. Therefore, the conventional complicated wafer bonding processes and the high aspect ratio circuit formation processes are not required. In addition, a pre-binning process can be performed on the side-by-side stacked light-emitting diode chips to further reduce the pixel structure volume, simplify the fabrication processes, improve yield and reduce cost. In the light-emitting diode device in accordance with some embodiments, red and blue light-emitting diode chips are stacked side by side on the green light-emitting diode chip, and the brightness of the pixel structure is controlled by the underlying green light-emitting diode chip to improve the light-emitting area and brightness. In some embodiments, a design of three anodes and one common-cathode for the light-emitting diode device is applicable. In some embodiments, the polarities of the cathodes and anodes of the three light-emitting diode chips can also be reversed to form a design of three cathodes and one common anode for the light-emitting diode device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode device, comprising:
  a pixel structure, comprising:
    a first light-emitting diode chip having a first top surface;
    a second light-emitting diode chip having a second top surface;
    a third light-emitting diode chip, having a light-emitting surface and a third top surface opposite to each other; wherein the first light-emitting diode chip and the second light-emitting diode chip are arranged side by side on the third top surface, the first light-emitting diode chip has a first vertical projection on the third top surface, the second light-emitting diode chip has a second vertical projection on the third top surface, and the first vertical projection and the second vertical projection do not overlap each other;
    a passivation layer covering the first light-emitting diode chip, the second light-emitting diode chip and the third light-emitting diode chip; and a first circuit layer, a second circuit layer, a third circuit layer and a fourth circuit layer separated from each other and located between the third light-emitting diode chip and the passivation layer; wherein the first circuit layer has a first bonding surface, the second circuit layer has a second bonding surface, the third circuit layer has a third bonding surface, and the fourth circuit layer has a fourth bonding surface, and wherein the passivation layer has openings, the openings respectively correspond to and are located on the first bonding surface of the first circuit layer, the second bonding surface of the second circuit layer, the third bonding surface of the third circuit layer and the fourth bonding surface of the fourth circuit layer; wherein vertical projections of the first bonding surface and the second bonding surface on the third top surface respectively overlap the first vertical projection and are separated from the second vertical projection, and vertical projections of the third bonding surface and the fourth bonding surface on the third top surface respectively overlap the second vertical projection and are separated from the first vertical projection.

2. The light-emitting diode device as claimed in claim 1, wherein the first light-emitting diode chip has a first electrode, the second light-emitting diode chip has a first electrode and the third light-emitting diode chip has a first electrode, wherein the first electrode of the first light-emitting diode chip, the first electrode of the second light-emitting diode chip, and the first electrode of the third light-emitting diode chip are electrically connected to each other.

3. The light-emitting diode device as claimed in claim 1, wherein the first circuit layer and the second circuit layer are both disposed on the first top surface of the first light-emitting diode chip away from the third light-emitting diode chip, wherein the third circuit layer and the fourth circuit layer are both disposed on the second top surface of the second light-emitting diode chip away from the third light-emitting diode chip.

4. The light-emitting diode device as claimed in claim 1, wherein the second circuit layer extends to cover the second top surface of the second light-emitting diode chip and/or the fourth circuit layer extends to cover the third top surface of the third light-emitting diode.

5. The light-emitting diode device as claimed in claim 1, wherein the fourth circuit layer extends to cover the first top surface of the first light-emitting diode chip.

6. The light-emitting diode device as claimed in claim 1, further comprising:
a distributed Bragg reflector sandwiched between the passivation layer and the first light-emitting diode chip, the second light-emitting diode chip and the third light-emitting diode chip, the distributed Bragg reflector covers sidewalls of the first light-emitting diode chip, the second light-emitting diode chip and the third light-emitting diode chip.

7. The light-emitting diode device as claimed in claim 1, further comprising:
a circuit substrate for providing the pixel structure disposed on the circuit substrate; and
a micro-control element disposed on the circuit substrate and electrically connected to the first circuit layer, the second circuit layer, the third circuit layer and the fourth circuit layer.

8. The light-emitting diode device as claimed in claim 1, further comprising:

a thin film transistor substrate disposed on the pixel structure and electrically connected to the first circuit layer, the second circuit layer, the third circuit layer and the fourth circuit layer.

9. The light-emitting diode device as claimed in claim 1, wherein the first light-emitting diode chip has a first top view area, the second light-emitting diode chip has a second top view area, and the third light-emitting diode chip has a third top view area, wherein a total area of the first top view area and the second top view area is less than the third top view area.

10. The light-emitting diode device as claimed in claim 1, wherein vertical projections of the first bonding surface and the second bonding surface are completely within the first vertical projection, and vertical projections of the third bonding surface and the fourth bonding surface are completely within the second vertical projection.

11. The light-emitting diode device as claimed in claim 1, wherein vertical projections of the first bonding surface and the second bonding surface are partially located outside a range of the first vertical projection, and vertical projections of the third bonding surface and the fourth bonding surface are partially located outside a range of the second vertical projection.

12. The light-emitting diode device as claimed in claim 1, wherein the first light-emitting diode chip has a first electrode, the second light-emitting diode chip has a first electrode and the third light-emitting diode chip has a first electrode, wherein the second circuit layer is electrically connected to the first electrode of the first light-emitting diode chip, the first electrode of the second light-emitting diode chip and the first electrode of the third light-emitting diode chip simultaneously, wherein the first electrode of the first light-emitting diode chip, the first electrode of the second light-emitting diode chip and the first electrode of the third light-emitting diode have the same polarity.

13. The light-emitting diode device as claimed in claim 12, wherein the first light-emitting diode chip has a second electrode, the second light-emitting diode chip has a second electrode and the third light-emitting diode chip has a second electrode, wherein the second circuit layer and the first circuit layer are respectively electrically connected to the first electrode and the second electrode of the first light-emitting diode chip, wherein the third circuit layer is electrically connected to the second electrode of the second light-emitting diode chip, wherein the fourth circuit layer is electrically connected to the second electrode of the third light-emitting diode chip and is electrically insulated from the second light-emitting diode.

14. The light-emitting diode device as claimed in claim 12, wherein the first light-emitting diode chip has a sidewall, the second light-emitting diode chip has a sidewall, and the third light-emitting diode chip has a first conductivity type semiconductor layer, wherein the light-emitting diode device further comprises:
a fifth circuit layer disposed on the second top surface of the second light-emitting diode chip and extending to cover the sidewall of the second light-emitting diode chip and the third light-emitting diode chip; wherein the fifth circuit layer is electrically connected to the first electrode of the second light-emitting diode chip and the first conductivity type semiconductor layer of the third light-emitting diode chip; wherein the second circuit layer extends to the sidewall of the first light-emitting diode chip and the third light-emitting diode chip, and is electrically connected to the first electrode of the first light-emitting diode chip and the first conductivity type semiconductor layer of the third light-emitting diode chip.

15. The light-emitting diode device as claimed in claim 1, wherein the first light-emitting diode chip emits a first color light, the second light-emitting diode chip emits a second color light, and the third light-emitting diode chip emits a third color light, wherein the first color light, the second color light and the third color light have different respective wavelength ranges.

16. The light-emitting diode device as claimed in claim 15, wherein the wavelength range of the third color light is between the wavelength range of the first color light and the wavelength range of the second color light.

17. The light-emitting diode device as claimed in claim 15, wherein the wavelength range of the second color light wavelength range is between the wavelength range of the first color light and the wavelength range of the third color light.

* * * * *